(12) United States Patent
Jindal et al.

(10) Patent No.: US 12,265,776 B2
(45) Date of Patent: Apr. 1, 2025

(54) IDENTIFYING TEST COVERAGE GAPS FOR INTEGRATED CIRCUIT DESIGNS BASED ON NODE TESTABILITY AND PHYSICAL DESIGN DATA

(71) Applicant: NXP USA, Inc., Austin, TX (US)

(72) Inventors: Anurag Jindal, Austin, TX (US); Kapil Narula, Austin, TX (US); Rahul Kalyan, Austin, TX (US); Hongkun Liang, Beijing (CN)

(73) Assignee: NXP USA, Inc., Austin, TX (US)

( * ) Notice: Subject to any disclaimer, the term of this patent is extended or adjusted under 35 U.S.C. 154(b) by 696 days.

(21) Appl. No.: 17/450,093

(22) Filed: Oct. 6, 2021

(65) Prior Publication Data

US 2022/0129613 A1 Apr. 28, 2022

(30) Foreign Application Priority Data

Oct. 27, 2020 (CN) .......................... 202011165581.6

(51) Int. Cl.
*G06F 30/398* (2020.01)
*G06F 30/392* (2020.01)

(52) U.S. Cl.
CPC .......... *G06F 30/398* (2020.01); *G06F 30/392* (2020.01)

(58) Field of Classification Search
CPC ...... G06F 21/554; G06F 21/57; G06F 21/575; G06F 21/64; G06F 21/71; G06F 21/73; G06F 21/74; G06F 21/78; G06F 13/4027; G06F 16/2246; G06F 16/2264; G06F 16/285; G06F 13/4068; G06F 13/409; G06F 2119/18; G06F 30/398; G06F 2115/08; G06F 30/30; G06F 30/3323; G06F 2119/12; G06F 2119/22; G06F 30/27; G06F 30/3312; G06F 30/3315; G06F 30/392; G06F 1/26; G06F 1/28; G06F 13/4009; G06F 13/4022; G06F 15/80; G06F 2111/20; G06F 2115/10; G06F 30/327; G06F 30/367; G06F 30/38; G06F 30/39; G06F 2113/10; G06F 16/182; G06F 16/24537; G06F 16/24544; G06F 16/2455;

(Continued)

(56) References Cited

U.S. PATENT DOCUMENTS 5,539,652 A 7/1996 Tegethoff
5,991,699 A 11/1999 Kulkarni et al.

(Continued)

OTHER PUBLICATIONS

Brosa, A.M. et al., "On Maximizing the Coverage of Catastrophic and Parametric Faults", Journal of Electronic Testing: Theory and Applications, Jun. 1, 2000, pp. 251-258, vol. 16, No. 3, Kluwer Academic Publishers, Dordrecht, NL.

(Continued)

*Primary Examiner* — Binh C Tat

(57) ABSTRACT

Test coverage for a circuit design may be determined by obtaining node testability data and physical location data for each node of a plurality of nodes in the circuit design. A determination is made that one or more low test coverage areas within the circuit design include untested nodes based on the node testability data and the physical location data of each node of the plurality of nodes. Test coverage data is generated for the circuit design including at least an identification of the one or more low test coverage areas.

16 Claims, 19 Drawing Sheets

(58) Field of Classification Search
CPC ........... G06F 16/24552; G06F 16/2456; G06F 16/2462; G06F 16/2471; G06F 16/27; G06F 16/278; G06F 18/2178; G06F 9/4881; G06F 18/21; G06F 18/25; G06F 9/5044; G06F 9/5055; G06F 18/213; G06F 21/445; G06F 9/451; G06F 2119/02; G06F 30/3308; G06F 30/333; H01L 2924/14; H01L 27/0207; H01L 27/092; H01L 27/1203
USPC .................................................. 716/118–125
See application file for complete search history.

(56) References Cited

U.S. PATENT DOCUMENTS

| | | | |
|---|---|---|---|
| 6,738,954 | B1 | 5/2004 | Allen et al. |
| 7,278,056 | B2 | 10/2007 | Hetmakpour |
| 7,389,215 | B2 | 6/2008 | Azatchi et al. |
| 8,347,260 | B2 | 1/2013 | Bernstein et al. |
| 10,120,787 | B1* | 11/2018 | Shemer ............... G06F 11/3688 |
| 2004/0205681 | A1 | 10/2004 | Nozuyama |
| 2004/0225973 | A1 | 11/2004 | Johnson |
| 2009/0210830 | A1 | 8/2009 | Butler et al. |
| 2020/0183812 | A1* | 6/2020 | Eberlein ............. G06F 11/3664 |
| 2020/0364134 | A1* | 11/2020 | Gal .................. G01R 31/31835 |

OTHER PUBLICATIONS

Tsai, Kun-Han, "Testability-Driven Fault Sampling for Deterministic Test Coverage Estimation of Large Designs", Proceedings of the 2014 IEEE 23rd Asian Test Symposium, Nov. 16, 2014, pp. 119-124, IEEE, Piscataway, NJ, USA.

Ungar, Louis Y. et al., "Simplified Metrics for Evaluating Designs for Testability", Autotestcon, Sep. 14, 2009, pp. 293-298, IEEE, Piscataway, NJ, USA.

* cited by examiner

|     | NODE IDENTIFIER | VALUE | TESTABILITY STATUS | MODULE | INSTANCE | ... |
|-----|---|---|---|---|---|---|
| 812 →| NODE_1 | 0 | TESTED | MODULE_A | INST_A | ... |
| 814 →| NODE_1 | 1 | TESTED | MODULE_A | INST_A | ... |
|     | NODE_2 | 0 | TESTED | MODULE_A_1 | INST_B | ... |
|     | NODE_2 | 1 | TESTED | MODULE_A_1 | INST_B | ... |
|     | NODE_3 | 0 | UNTESTED | MODULE_A_1_2 | INST_C | ... |
|     | NODE_3 | 1 | UNTESTED | MODULE_A_1_2 | INST_C | ... |
|     | ... | ... | ... | ... | ... | ... |
| 816 →| NODE_10000 | 0 | UNTESTED | MODULE_BC_1_2_X | INST_M | ... |
| 818 →| NODE_10000 | 1 | UNTESTED | MODULE_BC_1_2_X | INST_M | ... |
|     | NODE_10001 | 0 | TESTED | MODULE_BD | INST_N | ... |
|     | NODE_10001 | 1 | TESTED | MODULE_BD | INST_N | ... |
|     | ... | ... | ... | ... | ... | ... |
|     | NODE_960500 | 0 | TESTED | MODULE_NM_1 | INST_XX | ... |
|     | NODE_960500 | 1 | TESTED | MODULE_NM_1 | INST_XX | ... |
|     | ... | ... | ... | ... | ... | ... |
|     | NODE_975000 | 0 | UNTESTED | MODULE_ABC_2 | INST_XY | ... |
|     | NODE_975000 | 1 | UNTESTED | MODULE_ABC_2 | INST_XY | ... |
|     | ... | ... | ... | ... | ... | ... |
|     | NODE_N | 0 | UNTESTED | MODULE_N | INST_Z | ... |
|     | NODE_N | 1 | UNTESTED | MODULE_N | INST_Z | ... |

| DIE AREA: (0,0) (9000000, 10000000) | | | | | | |
|---|---|---|---|---|---|---|
| NODE IDENTIFIER *904* | MODULE IDENTIFIER *906* | INSTANCE IDENTIFIER *908* | MODULE IDENTIFIER *910* | INSTANCE LOCATION *912* | NODE LOCATION *914* | ... |
| NODE_1 | MODULE_A | INST_A | XA:XG, YA:YZ | XA:XB, YA:YB | XA, YB | ... |
| NODE_2 | MODULE_A_1 | INST_B | XB:XN, YA:YN | XB:XD, YB:YE | XC, YC | ... |
| ... | ... | ... | ... | ... | ... | ... |
| NODE_10001 | MODULE_BD | INST_N | XAA:XAN, YAA:YAN | XAB:XAG, YAA:YAC | XAC, YAB | ... |
|  | ... | ... |  |  |  | ... |
| NODE_975000 | MODULE_ABC_2 | INST_XY | XBB:XBN, YBB:YBN | XBB:XBG, YBC:YBE | XBD, YBD | ... |
|  | ... | ... | ... | ... | ... | ... |
| NODE_N | MODULE_N | INST_Z | XNN:XNZ, YNN:YNZ | XNP:XW, YNP:YNW | XNP, YNW | ... |

*916* → (points to NODE_1 row)

*FIG. 9*

| HID | HIER/MOD | PID | DETECTED | TESTABLE | TEST COV % | UNDETECTED | FAULT COV % | TOTAL FAULTS |
|---|---|---|---|---|---|---|---|---|
| 0 | TOP | 0 | 822334 | 861167 | 95.49 | 38833 | 95.03 | 865332 |
| 1 | MODULE_A | 1 | 822167 | 860554 | 95.54 | 38387 | 95.08 | 864674 |
| 2 | MODULE_A_1 | 2 | 718499 | 734846 | 97.78 | 16347 | 97.42 | 737536 |
| 3 | MODULE_A_1_2 | 3 | 3427 | 3792 | 90.37 | 365 | 89.11 | 3846 |
| ... | ... | ... | ... | ... | ... | ... | ... | ... |
| N | MODULE_N | Z | 17 | 20 | 85 | 3 | 85 | 20 |

| CLUSTER PRIORITY *1802* | CLUSTER ID *1804* | UNDETECTED *1806* | HIER/MOD AND CONTRIBUTION *1808* | CLUSTER LOCATION *1810* | ... |
|---|---|---|---|---|---|
| 1 | 0 | 500000 | MODULE_A →7000<br>MODULE_AB_4 →2000<br>...<br>MODULE_BB →1000 | LOCATION_1 | ... |
| 2 | 10 | 425000 | MODULE_A →3000<br>MODULE_C_1 →2700<br>...<br>MODULE_D_5 →500 | LOCATION_2 | ... |
| 3 | 100 | 415000 | MODULE_F →2500<br>MODULE_T_1_2 →2200<br>...<br>MODULE_YY →200 | LOCATION_3 | ... |
| 4 | 5 | 350000 | MODULE_E →1500<br>MODULE_X_1_1 →700<br>...<br>MODULE_YY →300 | LOCATION_4 | ... |
| ... | ... | ... | ... | | ... |
| N | N | N | MODULE_S_2 →500<br>MODULE_S_2_1 →80<br>...<br>MODULE_V_2_3 →15 | LOCATION_N | ... |

Row 1812 points to the first data row.

*FIG. 18*

| HIER/MOD | TEST COV % | TOTAL FAULT | FAULT COV % | UNDETECTED | CLUSTER UNTESTED FAULTS/NODES |
|---|---|---|---|---|---|
| MODULE_A | 95.54 | 864674 | 95.08 | 38387 | 10000 |
| MODULE_CD | 27.24 | 658 | 25.38 | 446 | 100 |
| MODULE_GT_1 | 75.75 | 39576 | 97.42 | 16347 | 2500 |
| ... | ... | ... | ... | ... | ... |

IDENTIFYING TEST COVERAGE GAPS FOR INTEGRATED CIRCUIT DESIGNS BASED ON NODE TESTABILITY AND PHYSICAL DESIGN DATA

CROSS-REFERENCE TO RELATED APPLICATIONS

This application claims the priority under 35 U.S.C. § 119 of China application no. 202011165581.6, filed on 27 Oct. 2020, the contents of which are incorporated by reference herein.

BACKGROUND

Field

The present invention generally relates to the field of electronic circuit design and, more particularly, relates to determining low-test coverage areas for integrated circuit designs.

Related Art

The design and fabrication of electronic systems, such as very large scale (VLSI) integrated circuits (ICs), is a very complex and thorough process. The design size and complexity of today's chips/circuits make it nearly impossible to design a chip without any mistakes or manufacture a chip without any defects. Therefore, IC designers implement various testing tools and methodologies to help ensure that a logical design of a chip conforms to its functional specification and that manufacturing defects are identifiable after the chip has been fabricated. Examples of these testing tools and methodologies include functional verification and Design for Testability (DFT) techniques. Functional verification tools can be used to confirm the functionality and logical behavior of the chip design by performing static verification, functional simulation, prototyping, and/or emulation operations on the logical design. DFT techniques may be utilized to add testability features, such as DFT logic, to the chip design. The DFT logic allows for tests, which were generated during a DFT stage of the design flow, to be executed on the fabricated chip to confirm whether its fabricated components are defect free.

One important goal of chip design/manufacturing testing is to exercise the tests across as much of the design/chip as possible. Therefore, designers utilize test coverage analysis tools to obtain test coverage metrics that indicate how well their tests have been exercised. Test coverage metrics typically quantify a likelihood of a defect/fault being screened for by a test based on the number of tested nodes in target modules. Ideally, a design/manufacturing test would provide 100% test coverage, i.e., test all possible nodes in all modules to screen for all possible defects/faults. However, obtaining 100% test coverage is generally not feasible or possible with today's IC designs because they have become increasingly complex with greater levels of circuit density. Therefore, achieving "as close to" 100% test coverage has become the industry standard.

Although conventional test coverage analysis tools are able to determine whether a given test is achieving test coverage goals, they are generally not qualitative enough to meet defectivity coverage goals of critical safety-related application spaces such as automotive, medical and aerospace where the test quality requirements are very high, and the expectation is to deliver near zero defective parts per billion (DPPB). In particular, conventional tools generally only provide an abstract metric of test coverage based on overall node counts for tested modules at a high level of the chip design. These tools typically fail to take into account physical design features such as spatial uniformity that can make a node more critical or less critical from a testing perspective. Spatial uniformity is an important concept because areas having an increased density of undetected fault represent a coverage hole at a systemic level. Missing coverage is systemically more prone to causing a problem later as compared to uniformly distributed undetected faults, which do not represent coverage loss at a systemic level. For critical and other markets, test coverage holes/gaps can lead to unscreened defects resulting in customer returns or, in a worst case, critical safety issues that can cause fatalities if not caught in a timely manner.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 8 illustrates one example of node testability data according to one embodiment of the present invention.

FIG. 9 illustrates one example of integrated circuit design physical space data according to one embodiment of the present invention.

FIG. 12 illustrates one example of overall/intermediate test coverage data according to one embodiment of the present invention.

FIG. 18 illustrates one example of test coverage data identifying areas of an integrated circuit design comprising test coverage gaps according to one embodiment of the present invention.

FIG. 19 illustrates another example of test coverage data identifying areas of an integrated circuit design comprising test coverage gaps according to one embodiment of the present invention.

DETAILED DESCRIPTION

Conventional test coverage analysis tools generally provide an abstract test coverage metric that is based on the number of testable and untestable nodes. For example, consider a scenario where a design/chip comprises 1,000,000 total testable nodes which are connectors of logical cells. The total number of testable nodes can be defined as a total number of nodes in the design (or area of interest) minus a total number of untestable nodes in the design (or area of interest). Nodes can be untestable for various reasons such as, but not limited to, architectural limitations. In this example, 920,000 of the nodes have been tested, and 80,000 of the nodes have not been tested. A conventional test coverage analysis tool would typically utilize only these tested/untested node counts at a modular level to determine that, in this example, the test under analysis has 92% test coverage. The resulting percentage, $P_{cov}$, is a representation of a probability of a test program screening a defect, where:

$$P_{cov}=100*(1-(N_{untested}/N_{testable})) \quad \text{(Equation 1)}$$

$P_{cov}$=percent coverage
$N_{testable}$=total number of testable nodes
$N_{untested}$=number of untested nodes Stated differently, test coverage can be defined as likelihood that a defect/fault will be screened. As the analysis scope level changes in conventional tools, the test coverage percentage ($P_{cov}$) will always represent the probability within that scope level to screen the defect assuming spatial uniformity of the untested nodes. However, the spatial distribution of untested nodes is rarely uniform due to the nature of chip and test design. As the spatial distribution of untested nodes becomes less uniform, the likelihood that this traditional test coverage calculation properly reflects the probability to screen a particular defect decreases. Therefore, in the example above, although the 92% test coverage may satisfy a coverage goal, the 80,000 untested nodes may be distributed in a non-spatially uniform manner such that one or more areas of the design have much less than 92% test coverage. Conventional test coverage analysis tools typically fail to identify these test coverage holes because they usually perform their operations only from a logical perspective (as compared to a physical space perspective) and typically do not take the physical space/design of a chip and spatial uniformity of untested nodes into consideration when performing their analysis.

Figure 1B:
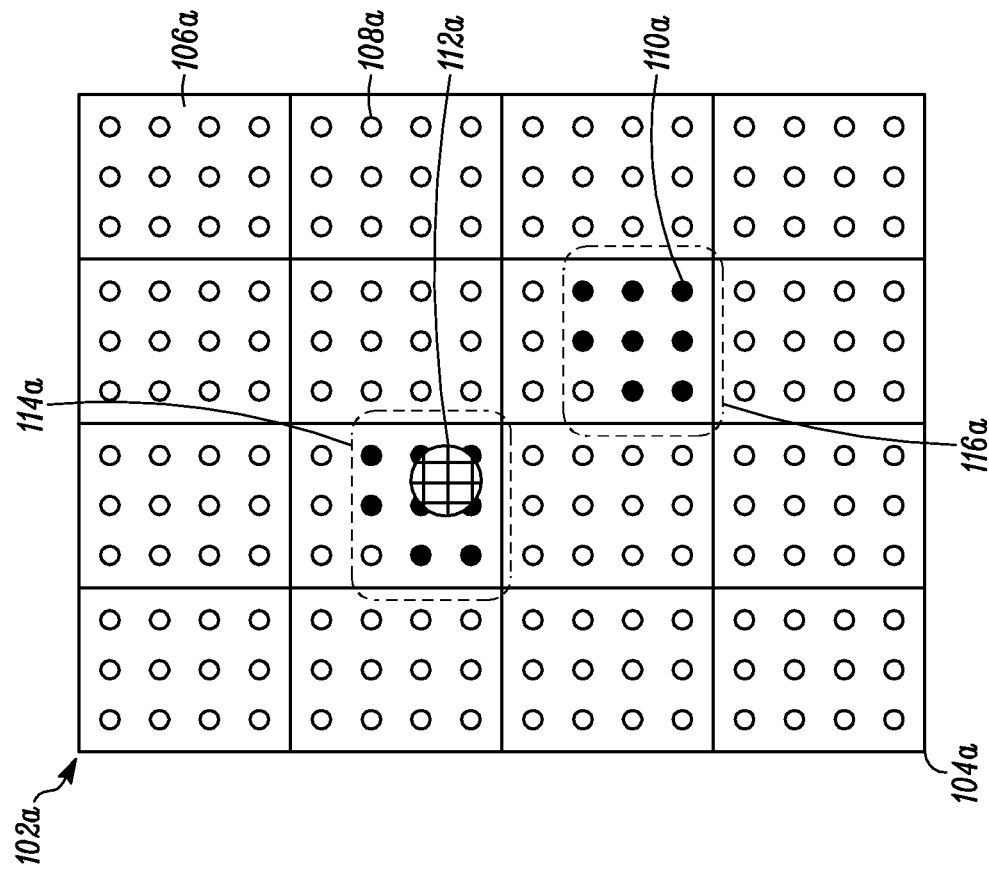
FIG. 1B illustrates one example of an abstract representation of tested and untested nodes in an integrated circuit design where the untested nodes are non-spatially uniform.
Figure 1A:
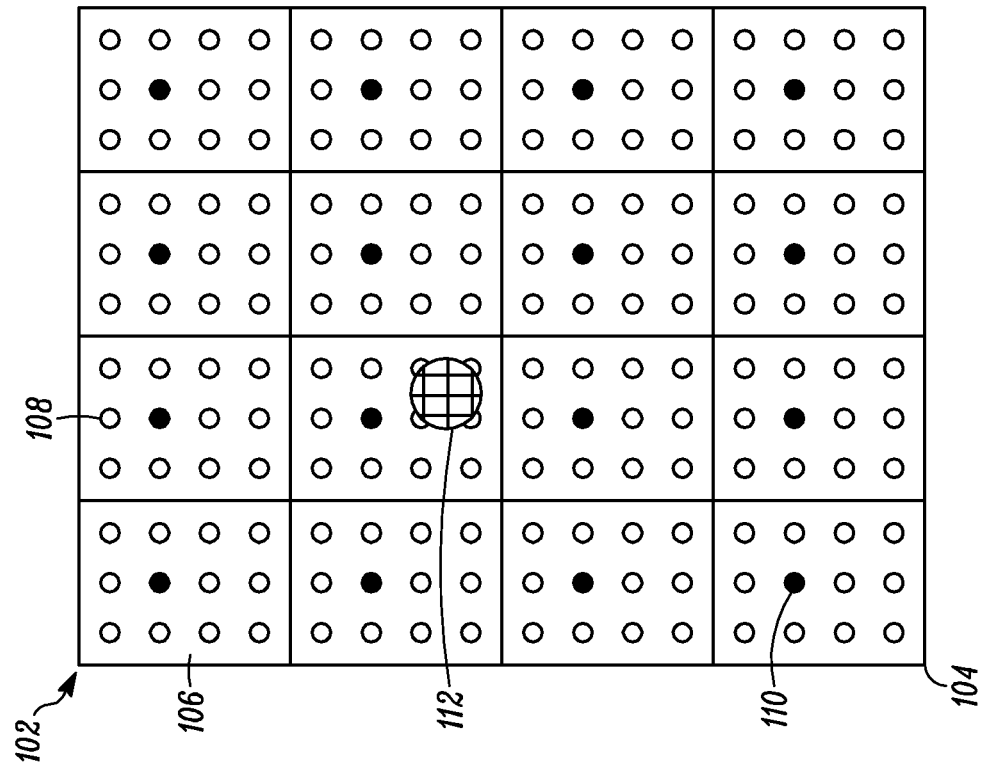
FIG. 1A illustrates one example of an abstract representation of tested and untested nodes in an integrated circuit design where the untested nodes are spatially uniform.

For example, consider the illustrations shown in FIGS. 1A and 1B. In these examples, distributions of tested and untested nodes are shown for two different design (or manufacturing) tests across the same high-level generalized chip design 102, 102a. The outer square 104, 104a in each illustration represents the entire chip, and each inner square 106, 106a represents either an entire module/submodule or a portion of a module/submodule in the chip design, where a module is a basic building design block that can comprise one or more submodules. Each open circle within each inner square 106, 106a represents a tested node 108, 108a within its module, and each closed circle represents an untested node 110, 110a within its module. The untested nodes 110 in FIG. 1A are spatially uniform while the untested nodes 110a in FIG. 1B are non-spatially uniform. For simplicity, only one inner square 106, 106a, one tested node 108, 108a, and one untested node 110, 110a in each design 102, 102a are labeled. The larger cross-hatched circle 112, 112a represents an area where a potential defect/fault can land.

In the examples shown in FIGS. 1A and 1B, it is assumed that a first test was performed on the design resulting in the distribution of tested and untested nodes in FIG. 1A, while a second test was performed on the design resulting in the distribution of tested and untested nodes in FIG. 1B. Each of the tests was performed at the full-chip level resulting in 176 out of the 192 total nodes being tested and 16 out of the 192 total nodes being untested. Therefore, a conventional test coverage analysis tool would indicate that both tests obtain 92% test coverage (100*(1−(16/192))=92%) utilizing Equation 1.

These test coverage results would lead a computer-implemented design tool or a designer into believing that both tests have an equivalent likelihood of screening a defect. However, this is not true because although FIG. 1A shows the potential defect 112 being screened for by the first test, FIG. 1B shows that the potential defect 112a was not screened for by the second test. Stated differently, the first test tested the nodes on which the potential defect 112 could land, but the second test did not test these nodes. This shows that when untested nodes 140 are spatially uniform (see FIG. 1A), the likelihood that defects/faults are screened for by the tests is higher than when the untested nodes 140a are non-spatially uniform (see FIG. 1B).

The non-spatially uniform untested nodes result in low coverage areas 114a, 116a of the chip design, as shown in FIG. 1B. This illustrates a concerning technical problem with conventional test analysis tools. In particular, even though conventional tools may indicate that test coverage goals, e.g., 92%, are being satisfied, there may be one or more areas of the design/chip, e.g., areas 114a, 116a, with much less coverage than what is being indicated by the metrics provided by these tools. The failure of conventional test coverage analysis tools to account for these test coverage holes presents a technical problem for IC design, testing and manufacturing industries because these testing holes can lead to unscreened defects resulting in customer returns or, in the worst case, critical safety issues that can cause fatalities if not caught in a timely manner.

As noted above, conventional test coverage analysis tools tend to fail at identifying these test coverage holes because they generally perform their operations only from a logical perspective and typically do not take the physical space/design of a chip and spatial uniformity of untested nodes into consideration when performing their analysis. Spatial uniformity is an important concept that should be considered when performing test coverage analysis. For example, manufacturing defectivity is calculated for fabricated chips by the foundries and is represented by a value known as chip defect density ($D_0$). Chip defect density is universally defined at the wafer-level as the number of defects per die per unit area. A single wafer comprises multiple dies, and within each die, there is an assumption of random defectivity. This means that, at the die-level scope, the defectivity is randomly distributed at a high-level and, therefore, spatially uniform.

However, the untested nodes are rarely spatially uniform due to chip and testing designs. Without accounting for the spatial uniformity/non-uniformity of untested nodes, there may be test coverage holes in areas of the design/chip having non-spatially uniform untested nodes, as illustrated in FIG. 1B. Test coverage analysis tools would need to be modified with many dependencies to determine that a design (or a manufacturing) test results in low coverage areas, e.g., areas 114a and 116a in FIG. 1B, when untested nodes are non-spatially uniform. Some of those dependencies include, but are not limited to, re-configuration of the analysis environment, manual intervention alongside deep knowledge, and understanding of functional behavior of logic areas in question, etc. For example, a conventional test coverage analysis tool would need to check test coverage at multiple levels of hierarchy down until the low coverage value is spotted, and all of the untested nodes must be contained within the same module at some X level of hierarchy.

Conventional analysis tools require the untested nodes to be contained within the same module because they are unaware of the module boundaries in a physical space, and, in a physical design module, boundaries are not necessarily always adjacent. The boundaries can be intertwined, which means adjacent nodes can be part of completely different modules. Given the millions/billions of nodes that a typical IC design includes, modifying conventional test coverage analysis tools to include these dependencies is not currently a feasible option given an amount of time, computing resources and financial resources it would take to determine coverage at all of these dependencies. In addition, if the untested nodes are not contained within the same module at some X level of hierarchy, existing test coverage analysis tools typically cannot determine that defects will not be screened because coverage is typically determined on an intra-module basis and not an inter-module basis.

Figure 2:
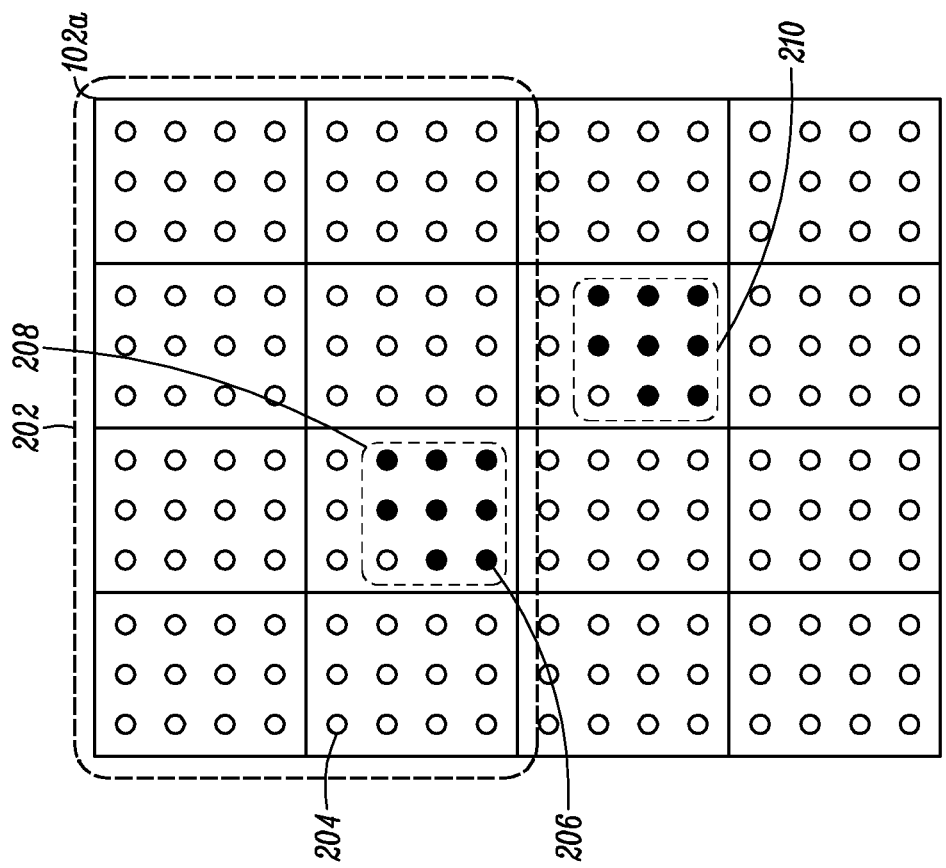
FIG. 2 illustrates one example of an abstract representation of a module in the integrated circuit design comprising tested and untested nodes where the untested nodes are non-spatially uniform.

FIGS. 2-5 illustrate the inefficiency and other disadvantages of conventional test coverage analysis tools when modified with multiple dependencies to identify low coverage areas within the same module. In particular, FIG. 2 shows the test coverage resulting from the second test discussed above with respect to FIGS. 1B and is directed to conventional test coverage analysis being performed on a first level down from the full chip. For example, the analysis is being performed within an entire module, Module_A 202. In this example, Module_A 202 is represented by an outlined rectangle. Module_A 202 includes a total of ninety-six (96) nodes, where both tests resulted in eighty-eight (88) tested nodes 204 and eight (8) untested nodes 206. Accordingly, a conventional test coverage analysis tool determines that the test coverage for the entirety of Module_A is 92% based on Equation 1. Similar to the full-chip level analysis discussed above with respect to FIGS. 1A and 1B, the conventional test coverage analysis for the top-level of Module_A fails to provide any indication that the second test resulted in low-test coverage for one or more areas 208, 210 in FIG. 2. In at least some embodiments, low-test coverage refers to a percentage of node test coverage for a given area that is less than or equal to a specified threshold percentage. However, in other embodiments, low-test coverage refers to a number of untested nodes within a given area that is greater than or equal to a specified threshold number of untested nodes.

Figure 3:
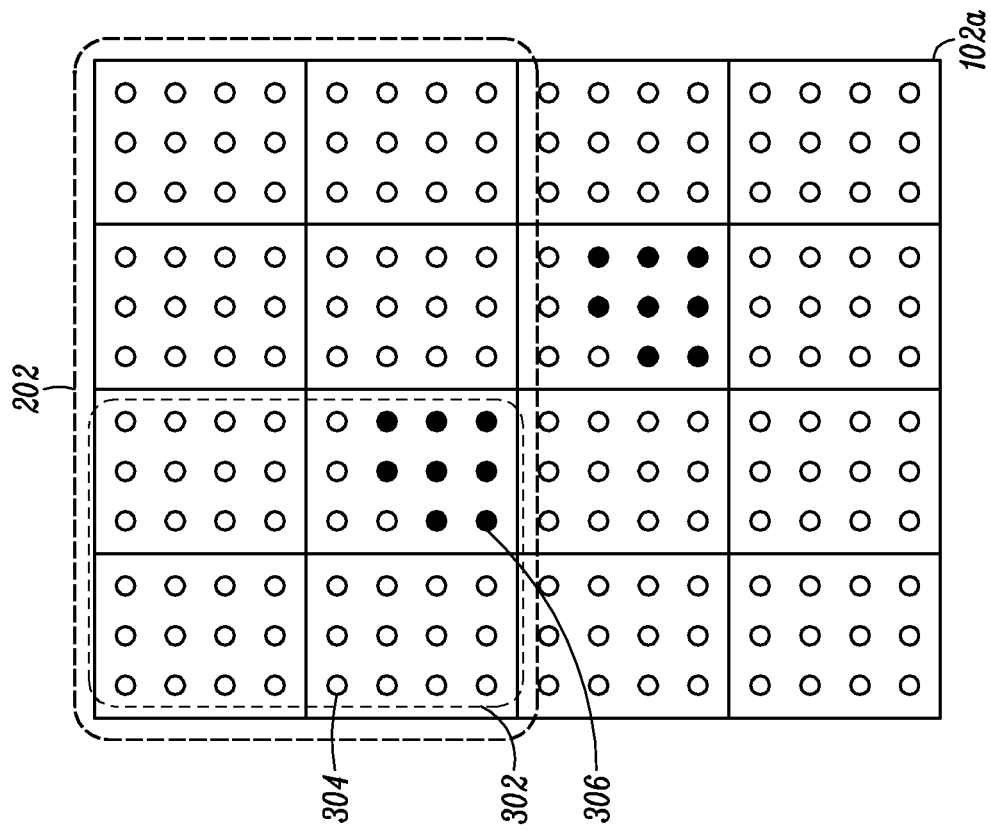
FIG. 3 illustrates one example of an abstract representation of a first submodule located within the module of FIG. 2 comprising tested and untested nodes where the untested nodes are non-spatially uniform.

FIG. 3 shows the conventional test coverage analysis being performed on a second level down from the full chip. For example, the analysis is being performed on a submodule, Module_A1 302, of Module_A 202. In this example, Module_A1 is represented by an outlined square within Module_A 202. Module_A1 302 includes a total of forty-eight (48) nodes, where the second test resulted in forty (40) tested nodes 304 and eight (8) untested nodes 306. Therefore, a conventional test coverage analysis would determine that the second test provided 84% test coverage at this level.

Figure 4:
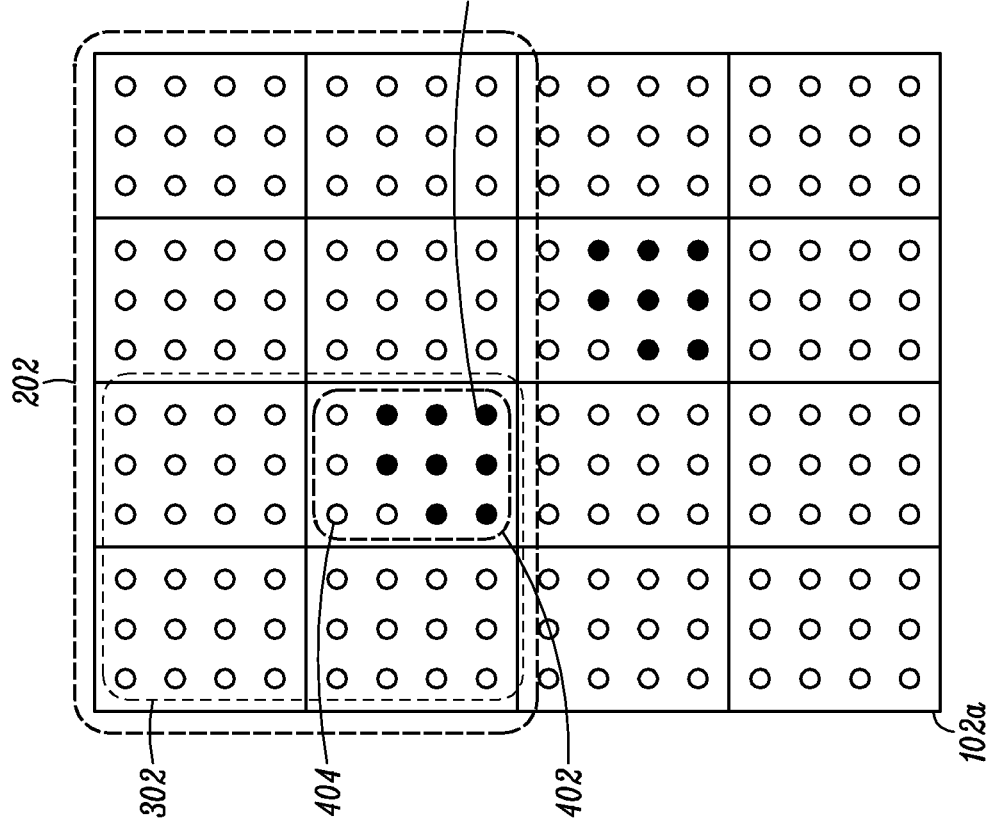
FIG. 4 illustrates one example of an abstract representation of a second submodule located within the first submodule of FIG. 3 comprising tested and untested nodes where the untested nodes are non-spatially uniform.

FIG. 4 shows the conventional test coverage analysis is performed on a third level down from the full chip. For example, the analysis is being performed on a submodule, Module_A2 402, of submodule Module_A1 302. In this example, Module_A2 402 is represented by an outlined square within Module_A1 302. Module_A2 402 includes a total of twelve (12) nodes, where the second test resulted in four (4) tested nodes 404 and eight (8) untested nodes 406. Therefore, a conventional test coverage analysis would determine that the second test provided 33% test coverage at this level.

Figure 5:
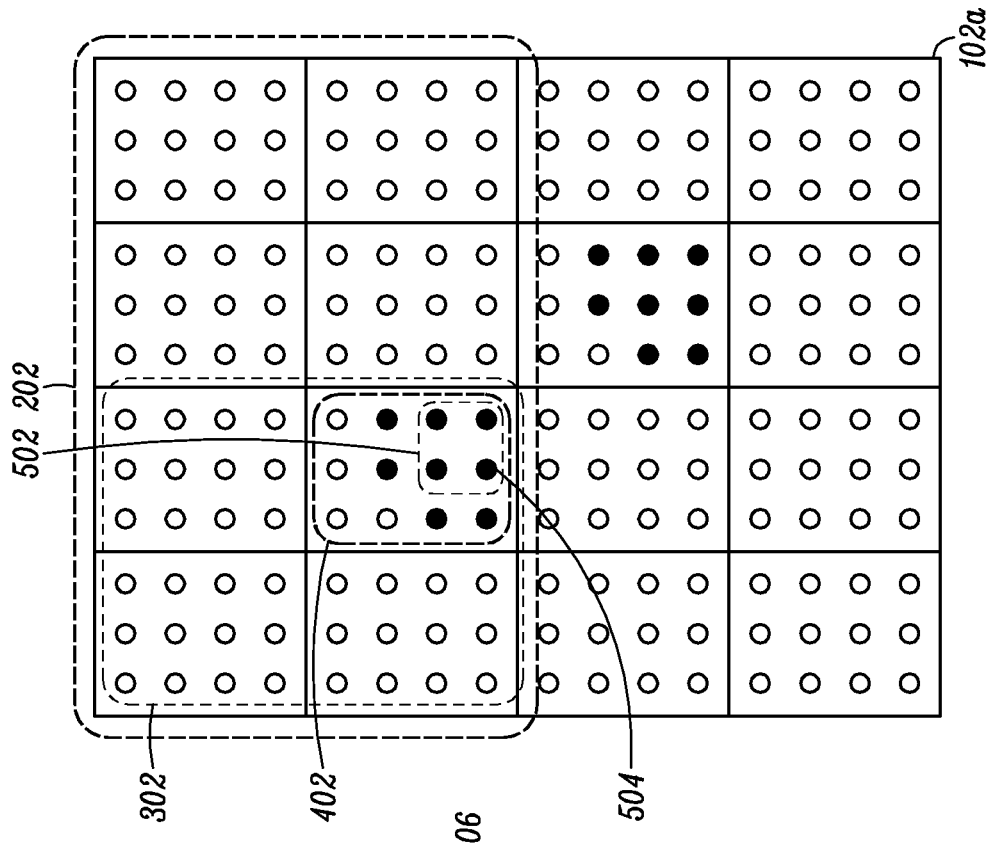
FIG. 5 illustrates one example of an abstract representation of a third submodule located within the submodule of FIG. 4 comprising only untested nodes.

FIG. 5 shows the conventional test coverage analysis being performed on a fourth level down from the full chip. For example, the analysis is being performed on a submodule, Module_A3 502, of Module_A2 402. In these examples, Module_A3 502 is represented by an outlined square within Module_A2 402. Module_A3 502 includes a total of four (4) nodes, where the test resulted in zero (0) tested nodes and four (4) untested nodes 504. Therefore, a conventional test coverage analysis would determine that the second test (see FIG. 1B) provided 0% test coverage at this level.

As shown, it took the conventional test coverage analysis tool approximately two to four levels of analysis in this simple example to determine that a low coverage area resides in a sub-level/hierarchy some X levels deep. When the simple example is scaled to a real-life design/chip, it would be nearly impossible to utilize conventional test coverage analysis tools for identifying low coverage areas within lower levels of a module given the complexities of a design/chip, the amount of dependencies that would need to be added to the tool, and the amount of time and resources the tool would require to identify low-test coverage areas. This inherent gap in conventional methods of coverage calculation requires multiple levels of manual analyses because conventional test coverage analysis tools showed that, although there is clearly a low coverage area, the abstract boundaries of modules caused conventional methods to only find the low coverage area after multiple steps in the analysis process.

In addition, even if conventional test coverage analysis tools are modified with multiple dependencies, they would not be able to determine low coverage areas across multiple modules because existing tools typically determine coverage on an intra-module basis and not an inter-module basis. Stated differently, conventional test coverage analysis tools do not analyze across module boundaries taking the physical domain into account. Consider FIG. 6, which illustrates another example of tested and untested node distributions resulting from a design (or a manufacturing) test across a high-level generalized chip design 602. Similar to FIGS. 1-5, the outer square 604 represents the entire chip, and each inner rectangle/square 606 to 620 defined by a dash/dotted line represents a module or sub-module within the chip design 602. In this example, there are three modules (Module_A 606, Module_B 608, and Module_C 610) and five submodules (Module_A_1, 612, Module_B_1 614, Module_C_1 616, Module_C_2 618, and Module_C_3 620).

Figure 6:
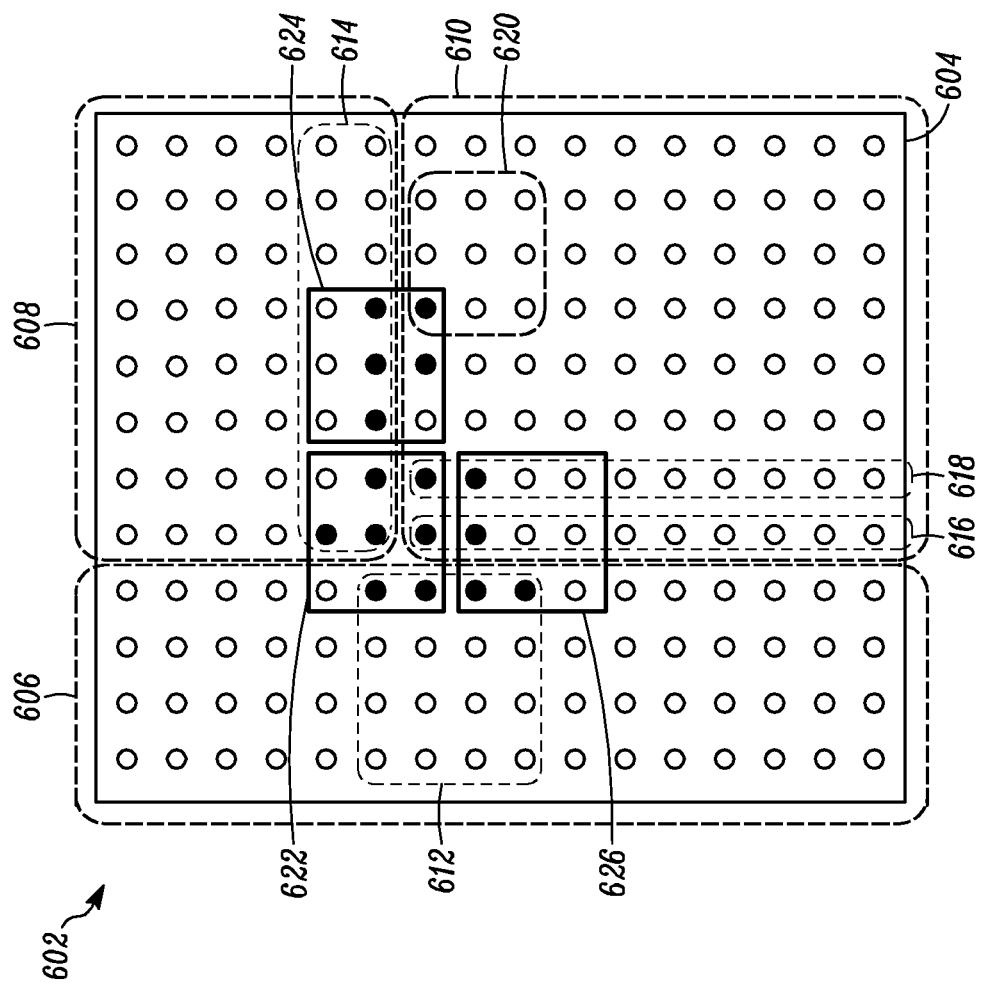
FIG. 6 illustrates one example of an abstract representation of multiple modules and submodules in the integrated circuit design comprising tested and untested nodes where low-test coverage areas comprising untested nodes distributed across multiple modules/submodules.

FIG. 6 further shows three low coverage areas 622, 624 and 626 defined by the solid line boxes. Each of these low coverages 622, 624 and 626 spans across multiple modules/submodules. For example, the first low coverage area 622 spans across Module_A 606, Module_A_1 612, Module_B_1 614, Module_C_1 616, and Module_C_2 618. The second low coverage area 624 spans across Module_B 608, Module_B_1 614, Module_C 610, and Module_C_3 620. The third low coverage area 626 spans across Module_A 606, Module_A_1 612, Module_C 610, Module_C_1 616, and Module_C_2 618. Conventional test coverage analysis tools would typically fail to identify the low-test coverage areas 622, 624 and 626 shown in FIG. 6 even if they are modified with the multiple dependencies discussed above because they generally perform their analysis only at a per-module level as compared to performing the analysis across modules/submodules.

For example, conventional tools are able to determine that the test coverage for Module_A_1 612 is 75%; the test coverage for Module_B_1 614 is 63%; the test coverage for Module_C_1 616 is 80%; the test coverage for Module_C_2 618 is 80%; and the test coverage for submodule Module_C_3 620 is 89% based on Equation 1. However, these test coverage percentages do not take into account or identify the low-test-coverage areas 622, 624 and 626 because they span across multiple modules/submodules. This illustrates a technical problem associated with conventional test coverage analysis tools because defects/faults are not being screened for in the low-test-coverage areas 622, 624 and 626, which can lead to customer returns, critical safety, and/or the like.

Embodiments of the present invention overcome the technical problems discussed above with respect to conventional test coverage analysis tools by utilizing the physical space data of the design/chip, which provides physical locations of chip components, e.g., modules and nodes, in conjunction with node testability data, which identifies nodes and their testability state, e.g., testable or untestable, to accurately and efficiently identify low-test coverage areas without requiring analysis at multiple levels of a module. In addition, embodiments of the present invention are able to quickly determine low coverage areas within the design/chip even when untested nodes are distributed across multiple modules and/or submodules. This allows for test coverage to be increased across the design/chip, which results in a decrease in unscreened defects.

For example, as will be discussed in greater detail below, a low-test coverage identifier receives physical space data and node testability data as inputs. Physical space data, in one embodiment, includes information such as coordinates representing the physical location of nodes on the chip being designed. Node testability data, in one embodiment, comprises information identifying each node in the current chip design and whether the node is tested or untested. The low-test coverage identifier utilizes these inputs to generate a map of the chip design, indicating the physical location of each untested node.

The low-test coverage identifier analyzes the mapped locations of the untested nodes to identify clusters of untested nodes throughout the design. The clusters may include untested nodes within a single module, a single submodule, multiple modules, and/or multiple submodules. The low-test coverage identifier determines one or more of these clusters to be low-test coverage areas for the design. For example, in the example shown in FIG. 6, the low-test coverage identifier 720 is able to identify areas 622, 624 and 626 as being low-test coverage areas (e.g., 22%, 44% and 56% test coverage, respectively) based on clustering of untested nodes. These areas are identified as low-test coverage areas even though the untested nodes span across multiple modules/submodules. The low-test coverage identifier utilizes this low-test coverage information to generate test coverage data that identifies areas of an integrated circuit design comprising test coverage gaps that are herein referred to as "optimized test coverage data". The optimized test coverage data, in one embodiment, includes data such as, but not limited to, physical location data associated with low-test coverage areas, identifiers of the untested nodes within a low-test coverage area, module/submodule/instance identifiers associated with the untested nodes, physical location data of the untested nodes within a low-test coverage area and (optionally) their associated module/submodule/instance, and test coverage percentage for the low coverage areas.

The optimized test coverage data is transmitted to, for example, designers and/or design tools such as functional verification tools, DFT tools, or other tools that are able to utilize the low-test coverage data of one or more embodiments to improve the test coverage for the identified low-test coverage areas. The optimized test coverage data may be utilized by the design tools and/or designers to revise and improve the design by updating the test(s) associated with the low-test coverage areas. Once the test has been revised, new or updated node testability data can be provided to the low-test coverage identifier based on the revised test. The test is herein referred to as an "optimized test" because the revised test increases test coverage in one or more areas identified as having test coverage gaps. If the updating/optimization of the test results in the physical space data of the design/chip are changed, then updated physical space data can also be provided to the low-test coverage identifier. The low-test coverage identifier then performs the operations discussed above to identify any low-test coverage areas of the design and generate new optimized test coverage data for the revised/updated test. This process can be performed as many times as needed until the low-test coverage identifier does not detect any more low-test coverage areas.

Once test coverage for the design/chip is determined to be within acceptable limits based on data provided by the test-coverage gap identifier and the remaining design parameters satisfy their goals/thresholds, the revised/updated design can be utilized to fabricate the chip. The revised design is herein referred to as an "optimized design" because the revised design includes increased node test coverage as compared to the previous design. Chips fabricated using designs revised/updated by one or more embodiments of the present invention have reduced or eliminated customer returns and critical safety issues when compared to chips fabricated using designs analyzed by conventional test coverage analysis tools because the revised/updated designs of one or more embodiments have reduced or eliminated low-test coverage areas that tend to cause returns or critical safety issues.

Figure 7:
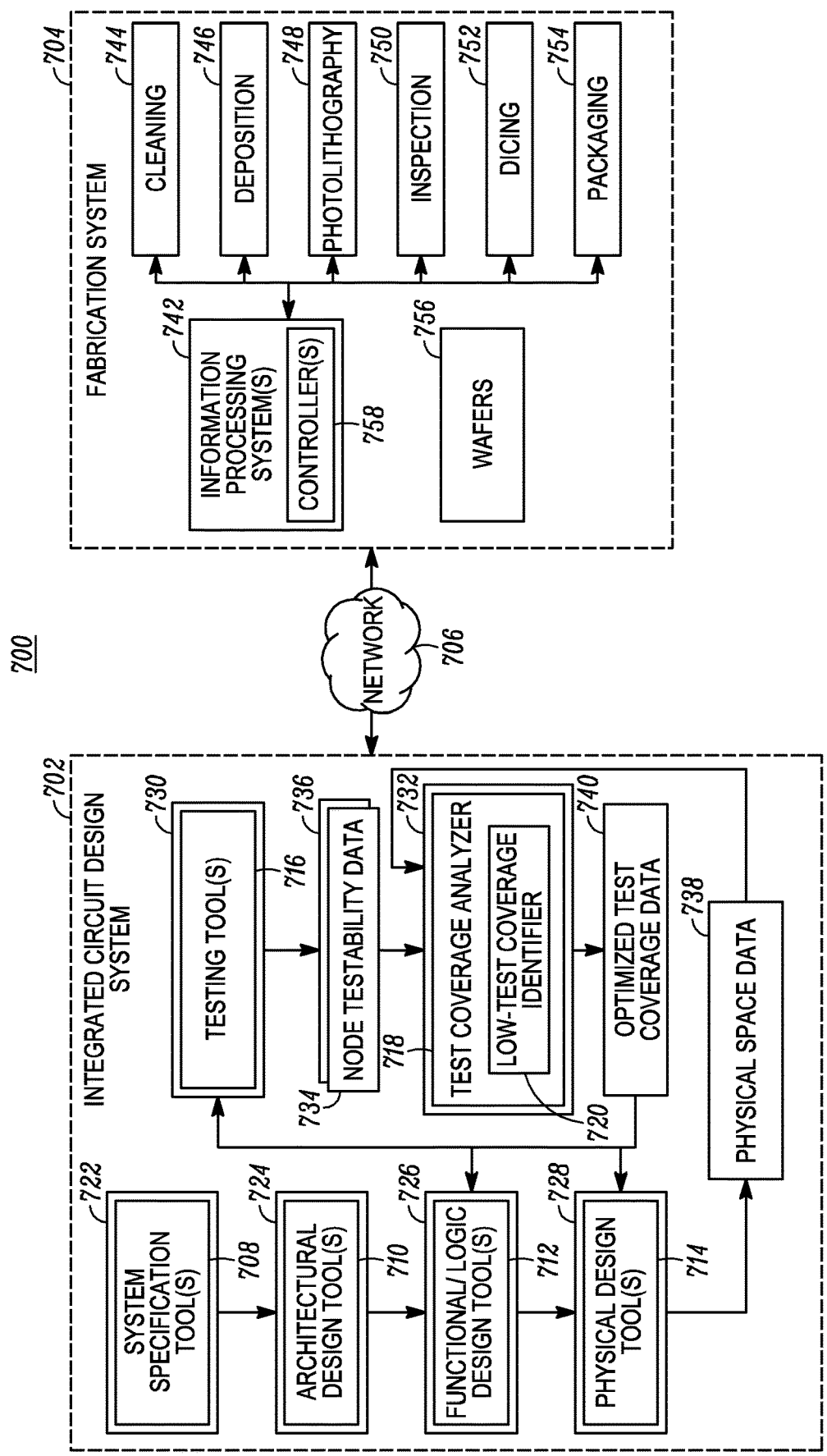
FIG. 7 is a block diagram illustrating one example of an operating environment according to one embodiment of the present invention.

FIG. 7 illustrates one example of an operating environment 700 according to one or more embodiments of the present invention. In one embodiment, the operating environment 700 comprises an integrated circuit design system 702 and a fabrication system 704. In some embodiments, a network 706 communicatively couple one or more components of these systems 702, 704 to each other and/or to other systems not shown. The network 706 may be implemented utilizing wired and/or wireless networking mechanisms. For example, the network 706 may comprise wireless communication networks, non-cellular networks such as Wi-Fi networks, public networks such as the Internet and private networks. The wireless communication networks support any wireless communication standard and include one or more networks based on such standards.

In one example, the integrated circuit design system 702 comprises one or more components for designing and testing digital and/or analog integrated circuits. For example, in one embodiment, the system 702 comprises one or more: system specification tool 708, architectural design tool 710, functional/logic design tool 712, physical design tool 714, testing tool 716, test coverage analysis tool 718, and low-test coverage identifier 720. Each of these components 708 to 720 may be implemented in one or more information processing systems 722 to 732, either as a hardware or software component.

Although one or more of these components 708 to 720 are shown as being implemented within separate information processing systems 722 to 732, two or more of these components may be implemented within the same information processing system. In addition, one or more of these components may be distributed across multiple information processing systems 722 to 732 as well. Also, multiple components may be combined into a single component, or combined components may be separated into separate and distinct components. For example, a test coverage analysis tool 718 may be part of a testing tool 716 as compared to being a separate component. In another example, a low-test coverage identifier 720 may be separate from a test coverage analysis tool 718 and/or any other tool. In some embodiments, the processes discussed below with respect to two or more of the components 708 to 720 may be performed in parallel and may also be performed in an iterative loop. Also, it should be understood that embodiments of the present invention are not limited to the configuration of the integrated circuit design system 702 shown in FIG. 7. For example, embodiments are applicable to any integrated circuit design system that generates/provides physical space data, e.g., Design Exchange Format (DEF) data, and node testability data. In addition, those of ordinary skill in the art have a technical understanding of typical designs flows and components found in integrated circuit design systems. Therefore, only a brief description will be provided for some of the components shown in the integrated circuit design system 702 of FIG. 7.

In one embodiment, the system specification tool 708 generates a system specification for a chip that defines functional specifications/requirements of the chip. The architectural design tool 710, in one embodiment, generates an architectural specification for the chip based on the system specification. The architectural specification specifies, for example, main functional blocks and their relationships, the interface and signals between the functional blocks, timing, performance, area, power constraints, etc. The functional/logic design tool 712 transforms the architectural specification into a logical design. The logical design models the circuit at, for example, a register transfer level (RTL), which is usually coded in a Hardware Description Language (HDL). The design includes, for example, details of intellectual property (IP) block instantiations, design connectivity, IC input and output pins, clock and reset strategy, etc.

One or more testing tool 716, such as a design verification tool, can functionally verify the logical design. It should be understood that although FIG. 7 shows the testing tool 716 being separate from the functional/logic design tool 712, the testing tool responsible for functionally verifying the logical design may also be part of the functional/logic design tool 712. The testing tool 716, for example, can emulate an electronic system corresponding to an integrated circuit according to the logical design, and/or simulate the functionality of the logical design in response to various test stimuli.

One goal of functional verification testing is to determine whether the logical design operated differently than expected in response to live data or a test stimulus. When the output from the emulated or simulated logical design is different than expected, a fault/bug is determined to have occurred. The testing tool 716 is able to record information associated with identified faults and transmit this data back to the functional/logic design tool 712 and/or a designer so that the logical design can be updated/revised to correct any issues. In one embodiment, the testing tool 716 and/or the functional/logic design tool 712 also generates node testability data 734 resulting from the functional verification process. The node testability data 734 identifies, for example, each of the nodes in the design, the modules comprising each of the nodes, the value each node can exhibit, and the testability of each node, e.g., tested or untested.

Once the logical design has been updated/revised, functional verification operations can be performed once again. This process repeats not only when the logical design is updated/revised based on fault/bug correction but also for any process in the design flow that can provide netlist/constraints for functional pattern evaluation by the testing tool 716. Examples of these processes include gate-level synthesized design, scan-inserted design, physically placed design (with optimized floorplan), initial clock tree integration, routed design, pre-final design, final taped-out design, and production test program.

The physical design tool(s) 714, in one embodiment, map the RTL generated during the functional/logic design process into actual geometric representations of the various electronic devices that will be part of the chip by the physical design tool(s) 714. One example of a physical design flow associated with the physical design tool(s) 714 includes logic synthesis, design-for-test (DFT), floorplanning, physical placement, clock insertion, routing, pre-final design (e.g., design for manufacturability), and final tape-out design.

During logic synthesis, the RTL code is translated into a gate-level netlist. For example, the RTL can be translated into a Boolean equation(s) that is technology independent. The equation can then be optimized, and any redundant logic may be removed. The optimized Boolean equation can then be mapped to technology-dependent gates. Once the gate-level netlist has been generated based on the logic synthesis process, a DFT process may be performed. The DFT process adds testability features, such as DFT logic, to the chip design. The DFT logic allows for tests, which were generated during the DFT stage of the design flow, to be executed on the fabricated chip to confirm whether its fabricated components are defect free or not with the goal of screening out parts from being shipped due to a critical defect found by the test.

DFT can be implemented by, for example, scan path insertion, memory built-in-Self-Test, and automatic test pattern generation (ATPG). ATPG typically generate test sets, which are a collection of test patterns, for testing various types of fault models such as stuck-at, transition, path delay faults, and bridging faults. The ATPG processes, in one embodiment, may be performed by at least one physical design tool 714 and/or at least one testing tool 716. In some embodiments, at least one testing tool 716 is part of one or more of the physical design tool 714.

In one embodiment, at least one of the physical design tool 714 and/or testing tool 716 also generates node testability data 736 resulting from the DFT processes. The node testability data 736 generated based on the DFT processes, in one embodiment, may be similar to the functional verification node testability data 734 discussed above. For example, the DFT node testability data 736 identifies, for example, each of the nodes in the design, the modules comprising each of the nodes, the value each node can exhibit, and the testability of each node, e.g., tested or untested. The embodiments of the present invention are not limited node testability data generated for functional verification and DFT, and any node testability data generated by any test during integrated circuit design may be utilized by various embodiments.

FIG. 8 shows one example of node testability data 800 according to one embodiment of the present invention. In this example, the node testability data 800 comprises the following types of data: node identifier data 802, node value data 804, testability data 806, module identifier data 808, and instance identifier data 810. However, it should be understood that other types of data are applicable as well, and one or more of the illustrated data types can be removed, and/or one or more different data types can be added. Here, a module refers to a basic building design block that can comprise one or more submodules. A module comprises one or more instances, each representing a utilization of given components such as logical very large-scale integration (VLSI) gates, e.g., AND, NAND, OR, NOR, etc. These logical gates can be comprised of transistors, resistors, capacitors, etc., within the module/submodule. Each instance may comprise one or more cells that each includes one or more gates. Nodes are the connectors on each logical cell/gate, and multiple instances then have an opportunity to be connected together via their respective nodes.

The node identifier data 802 comprises a unique identifier/name associated with a given node. The node value data 804 comprises the value that the associated node can exhibit, such as "0" or "1". The testability data 806 identifies whether the associated node is testable or untestable for the associated value, e.g., "0" or "1". The module identifier data 808 comprises a unique identifier/name associated with the module comprising the node. The instance identifier data 810 comprises a unique identifier/name of the instance within the module that comprises the node.

For example, consider a first set of entries 812, 814 in the node testability data 800. These entries show that a node having the node identifier "Node_1" is testable for both its values "0" and "1". These entries also show that a module having the module identifier "Module_A" comprises an instance having the instance identifier "Inst_A", which comprises "Node_1". In another example, a second set of entries 816, 818 shows that a node having the node identifier "Node_10000" is untestable for both its values "0" and "1". These entries 816, 818 also show that a module having the module identifier "Module_BC_1_2_X" comprises an instance having the instance identifier "Inst M" that comprises "Node_10000". In this example, Module_BC is the top-level module; BC_1 is a first level submodule within Module_BC; BC_1_2 is a second level submodule within submodule BC_1; and BC_1_2_X is a third level submodule within submodule BC_1_2. In some embodiments, two or more of the node identifier data 802, module identifier data 808, and the instance identifier data 810 may be combined.

Referring back to FIG. 7, after (or in parallel with) the DFT process, the physical layout of the chip may begin. Physical layout is the transition from the logical view to the physical view of the chip. Physical layout includes processes such as floorplanning, partitioning, physical placement, clock insertion, routing, and design for manufacturability. Floorplanning includes assigning/placing design blocks to physical locations in the die area, pin placement, power optimization, etc. Partitioning includes dividing the die area into functional blocks to help with placement and routing. Physical placement includes assigning gates in the netlist to non-overlapping locations on the die area. Clock insertion includes introducing clock signal wiring into the design. Routing includes adding wires to the design that connect the gates in the netlist via their respective nodes. Design for manufacturability processes increase the ease of manufacturing the chip while complying with design rules set by the foundry.

The physical layout processes generates physical space/design data 738 that represents the physical layout of the chip, such as the netlist and circuit layout. For example, the physical space data 738, in one embodiment, may include data such as the identifiers of nodes within the design, the physical location of each node on the die/chip, the module name associated with each node, the physical location of each module, etc. One example of physical space data 738 is a Design Exchange Format (DEF) file.

FIG. 9 shows one example of physical space data 900 according to one embodiment of the present invention. In this example, the physical space data 900 comprises the following types of data: die area data 902, node identifier data 904, module identifier data 906, instance identifier data 908, module location data 910, instance location data 912 and node location data 914. It should be understood that other types of data are applicable as well, and one or more of the illustrated data types can be removed and/or one or more different data types can be added. For example, additional data types such as "cell name", which describes the type of logical gate the instance is, or "rotation", which indicates how the instance is orientated, may also be included as part of the physical space data 900. In another example, module location data 910 is not required and only one of instance location data 912 and node location data 914 may be included within the physical space data 900.

The die area data 902 indicates the bounding box of the die such that locations of modules, instances, nodes, etc., can be determined within this area. The node identifier data 904 comprises a unique identifier/name associated with a given node. The module identifier data 906 comprises a unique identifier/name associated with the module comprising the node. The instance identifier data 908 comprises a unique identifier/name of the instance within the module that comprises the node. The module location data 910 comprises coordinates or other location indicating where on the die/chip the corresponding module is physically located. The instance location data 912 comprises coordinates or other location data indicating where on the die, the corresponding instance is physically located. The node location data 914 comprises coordinates or other location data indicating where on the die the corresponding node is physically located. For example, consider a first entry 916 in the physical space data 900. This entry 916 shows that Module_A is located from position A to position G along the X-axis of the die and position A to position Z along the Y-axis of the die. The instance Inst_A, in this example, is located from position A to position B along the X-axis of the die and position A to position B along the Y-axis of the die. The node Node_1, in this example, is located at position A on the X-axis of the die and position B on the Y-axis of the die. It should be understood that other conventions for representing locations of modules, nodes, instances, etc., are applicable as well. Also, only one entry 916 is labeled in FIG. 9 for simplicity. Also, in some situations, locations of each node relative to each other within an instance may be trivial in difference. Therefore, in some embodiments, the location data of the instance may be used to establish a coordinate of the multiple nodes related to that instance.

It should be understood that, at least in some embodiments, other inputs in addition to the node testability data 734, 736 and physical space design data 738 can be utilized by the low-test coverage identifier 720 to perform one or more operations described herein. One example of such additional input includes historical customer returned part data that shows a particular node or set of nodes having a high likelihood of failure. This data can be added as input to the low-test coverage identifier 720 regardless of testability of the node to highlight "problem areas". The highlighted problem areas can be combined with other untested areas to further highlight a problem. In addition, nodes may be untestable for various reasons such as architectural limitations, and ATPG not being able to find a method to test in time. The low-test coverage identifier 720 can filter the node testability data 734, 736 based on such data to only consider testability data of interest. Also, the low-test coverage identifier 720 can also filter the node testability data 734, 736 and physical space design data 738 based on module name. For a certain module function, such as test-specific logic, may not be desired a part of the test coverage analysis because, for example, the testability and value of testability on that module is low. Therefore, the low-test coverage identifier 720 can filter out input data associated with this module so that subsequently generated optimized test coverage data 740 is not misconstrued by such data.

Referring back to FIG. 7, the integrated circuit design system 702 further comprises one or more test coverage analysis tools 718 that perform test coverage analysis operations during the functional/logic design and physical design processes. The test coverage analysis tools 718, in one embodiment, utilize the node testability data 734, 736 to determine how well the various tests performed or generated during the logical and physical design processes exercise the design/chip. For example, during functional verification testing, a test coverage analysis tool 718 utilizes the corresponding node testability data 734 to determine how well the test stimulus, e.g., functional patterns, exercised the functionality of the logical design. In another example, during DFT operations, a test coverage analysis tool 718 utilizes the corresponding node testability data 736 to determine how well test stimulus, e.g., test patterns generated by ATPG, exercises the design/chip to identify various types of faults.

The test coverage analysis tool 718 is able to generate test coverage data for a given test by analyzing the corresponding node testability data 734, 736. This test coverage data, in at least some embodiments, is considered unoptimized because it may only take into consideration node testability data 734, 736, and may comprise of unidentified low-test coverage areas. For example, the test coverage analysis tool 718 can generate unoptimized test coverage data determining test coverage based on Equation 1 above for a given number of levels within the design.

Figure 10:
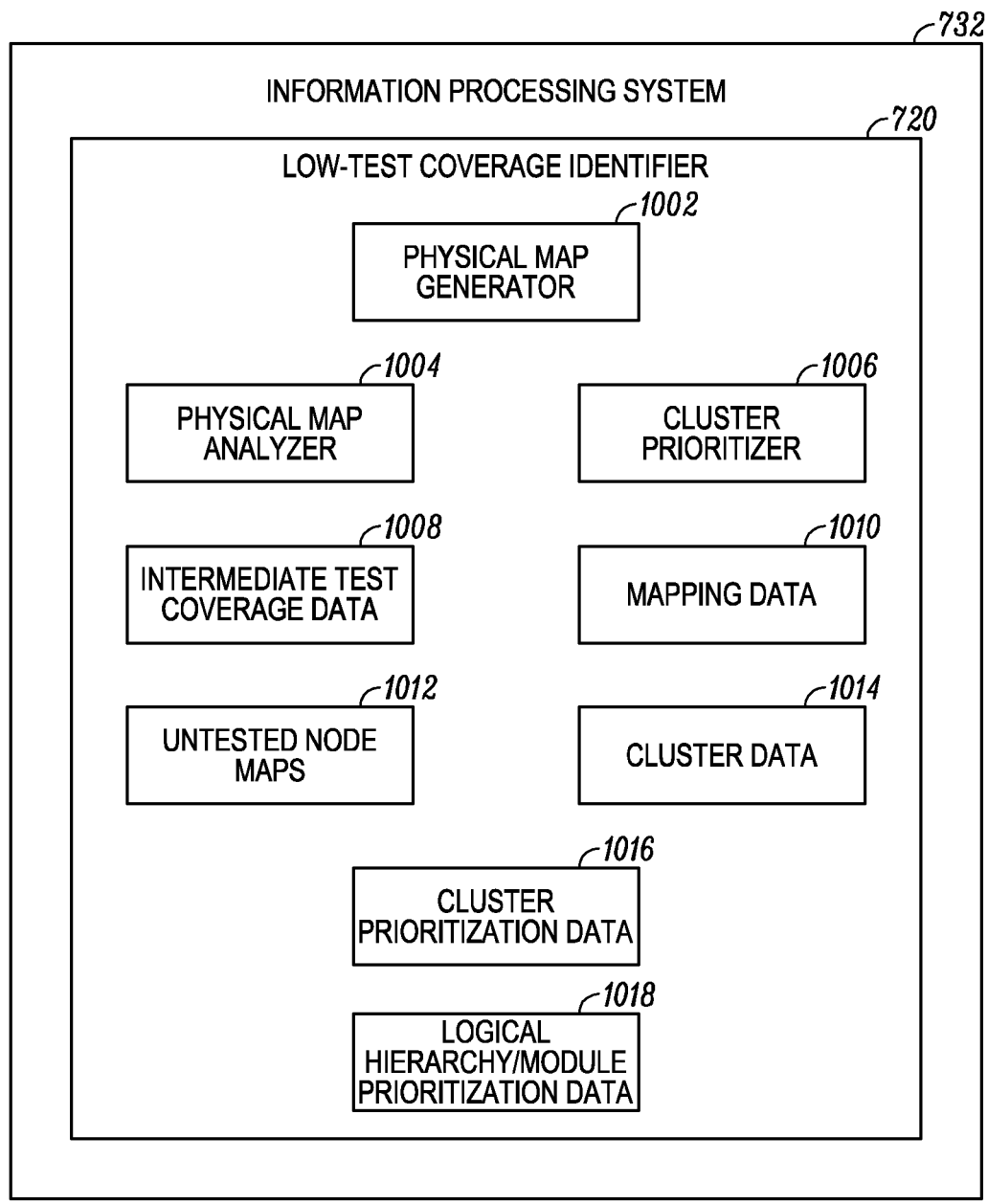
FIG. 10 is a block diagram illustrating a more detailed view of a low-test coverage identifier according to one embodiment of the present invention.

However, in addition to the test coverage analysis tool 718, the integrated circuit design system 702 also comprises one or more low-test coverage identifiers 720. FIG. 10 shows a more detailed view of the low-test coverage identifier 720 according to one embodiment of the present invention. In this embodiment, an information processing system 732 is shown as comprising the low-test coverage identifier 720. However, in other embodiments, the low-test coverage identifier 720 may be a standalone system. In addition, although FIG. 10 shows the low-test coverage identifier 720 as being separate component within the information processing system 732, it may be a component of the functional/logic design tool 712, the physical design tool 714, the testing tool 716, and/or the test coverage analysis tool 718. In one embodiment, the low-test coverage identifier 720 comprises a physical mapping data generator 1002, a map analyzer 1004, an untested node cluster prioritizer 1006, intermediate test coverage data 1008, mapping data 1010, one or more untested node maps 1012, untested node clustering data 1014, cluster prioritization data 1016, and logical hierarchy/module prioritization data 1018. It should be understood that the terms "hierarchy" and "module" are used interchangeably throughout this discussion. Each of these components is discussed in greater detail below. It should be understood that, in other embodiments, two or more of these components may be combined into a single component.

As will be discussed in greater detail below, the low-test coverage identifier 720 generates optimized test coverage data 740 by utilizing the node testability data 734, 736 in combination with the physical space data 738 generated during the physical design processes to determine low-test coverage areas within the design/chip. In some embodiments, the unoptimized test coverage data may be combined with low-test coverage data generated by the low-test coverage identifier 720 to form the optimized test coverage data 740. In other embodiments, the test coverage analysis tool 718 is not required to generate separate test coverage data. For example, the low-test coverage identifier 720 is able to determine overall test coverage data at various levels of the design based on corresponding node testability data 734, 736 data and then optimize this test coverage data by further determining low-test coverage areas based on a combination of the testability data 734, 736 and physical space data 738.

The optimized test coverage data 740, in one embodiment, may be transmitted to one or more of corresponding integrated circuit design tools, such as the functional/logic design tools 712 and/or physical design tools 714; may be stored in one or more local and/or remote storage devices; may be transmitted to one or more local and/or remote information processing systems via the network 706; and/or a combination thereof. The optimized test coverage data 740 enables the functional/logic design tools 712 and/or physical design tools 714 and/or a designer to modify, for example, the logical and/or physical design so that the low-test coverage areas of the design identified by the optimized test coverage data 740 are addressed.

For example, the data utilized by functional pattern generators for functional verification testing and/or the data utilized during the DFT process for automatic test pattern generation can be updated/revised based on the optimized test coverage data 740 to increase test coverage in the identified low-test coverage areas. The above processes can be iteratively performed until the low-test coverage identifier 720 no longer identifies low-test coverage areas within the design. In one embodiment, this determination is made based on analyzed areas having test coverage satisfying a given test coverage threshold.

The completion of the above design processes and test coverage analysis operations result in a pre-final design for the chip. The above processes may be repeated numerous times and may be performed in parallel even after a taped-out design is obtained by adding additional stimuli that exercise more nodes than previously may have been done. After the logical and physical designs/tests of the chip have been revised based on the optimized test coverage data 740 and all design requirements have been satisfied, a taped-out design is obtained and sent to a fabrication system, e.g., a foundry, such as the fabrication system 704 illustrated in FIG. 7. The semiconductor fabrication plant 704 is responsible for the manufacturing and packaging of semiconductor devices and utilizes the taped-out design to fabricate the design chip. In one embodiment, the semiconductor fabrication plant 704 comprises one or more information processing systems 742; fabrication and packaging stations/components 744 to 754; and semiconductor wafers 756.

The information processing system 742 controls the one or more fabrication/packaging stations and their components. In one embodiment, the information processing system 742 may comprise at least one controller 758 that may be part of one or more processors or may be a component that is separate and distinct from the processor(s) of the information processing system 742. The one or more fabrication and packaging stations 744 to 754 may include a cleaning station 744, a deposition station 746, a photolithography station 748, an inspection station 750, a dicing station 752 and/or a packaging station 754.

In some embodiments, two or more of fabrication/packaging stations are separate from each other, where a semiconductor wafer 756 is moved from one station to a different station after processing. However, in other embodiments, two or more of these stations may be combined into a single station. In addition, one or more of the stations/components 744 to 754 may not be a physical station per se but may refer to a fabrication or packaging process(es) performed by components of the fabrication plant 704. It should be understood that the semiconductor fabrication plant 704 is not limited to the configuration shown in FIG. 7.

An integrated circuit, in one embodiment, may be fabricated according to the taped-out design that is based on the optimized test coverage data 740 as follows. First, a semiconductor wafer 756 is inspected for any defects. After the wafer 756 has been inspected, the wafer 756 is processed by the cleaning station 744. The cleaning station 744 removes any contaminants from the surface of the wafer 756 using, for example, a wet chemical treatment. Then, the wafer 756 is processed by the deposition station 746. The deposition station 746 deposits, grows, and/or transfers one or more layers of various materials are onto the wafer using processes such as chemical vapor deposition (CVD), physical vapor deposition (PVD) and atomic layer deposition (ALD).

After the desired materials have been deposited, the wafer 756 is processed by the photolithography and etching station 748. For example, the wafer 756 may be cleaned and prepared by removing any unwanted moisture from the surface of the wafer 756. An adhesion promoter may also be applied to the surface of the wafer 756. A layer of photoresist material is then formed on the surface of wafer 756 (or the adhesion promoter layer is formed). A process such as, but not limited to, spin coating may be used to form the photoresist layer. Excess photoresist solvent may be removed by pre-baking the coated semiconductor wafer 756. The photoresist coated wafer 756 is then exposed to one or more patterns of light. The patterns may be formed by projecting the light through a photomask (also referred to herein as "mask") created for the current layer based on the taped-out design obtained from the design processes discussed above. The taped-out design, in one embodiment, comprises all shapes/patterns that are intended to be printed on the wafer taped-out design for a given layer.

The bright parts of the image pattern cause chemical reactions, which result in one of the following situations depending on the type of resist material being used. Exposed positive-tone resist material becomes more soluble so that it may be dissolved in a developer liquid, and the dark portions of the image remain insoluble. Exposed negative-tone resist material becomes less soluble so that it may not be dissolved in a developer liquid, and the dark portions of the image remain soluble.

A post-exposure bake (PEB) process may be performed that subjects the wafer 756 to heat for a given period of time after the exposure process. The PEB process performs and completes the exposure reaction. The PEB process may also reduce mechanical stress formed during the exposure process. The wafer 756 is then subjected to one or more develop solutions after the post-exposure bake. The develop solution(s) dissolves away the exposed portions of the photoresist. After development, the remaining photoresist forms a stenciled pattern across the wafer surface, which accurately matches the desired design pattern. An etching process is then performed that subjects the wafer 756 to wet or dry chemical agents to remove one or more layers of the wafer 756 not protected by the photoresist pattern. Any remaining photoresist material may then be removed after the etching process using, for example, chemical stripping, ashing, etc. It should be understood that semiconductor fabrication is not limited to the above-described process, and other fabrication processes are applicable as well.

The photolithographic process results in a layer of patterned features (also referred to herein as a "layer of patterns", "layer of features", "pattern of features", "patterns", and/or "pattern"). After the current layer of features has been patterned, the wafer 756 is processed by one or more defect inspection stations 750. In one embodiment, the defect inspection station 750 inspects the current layer of patterned features for defects and corrects/manages any defects using one or more methods known to those of ordinary skill in the art. The above-described processes are then repeated until all of the desired layers of patterned features have been formed, and fabrication of the wafer 756 has been completed.

Figure 11:
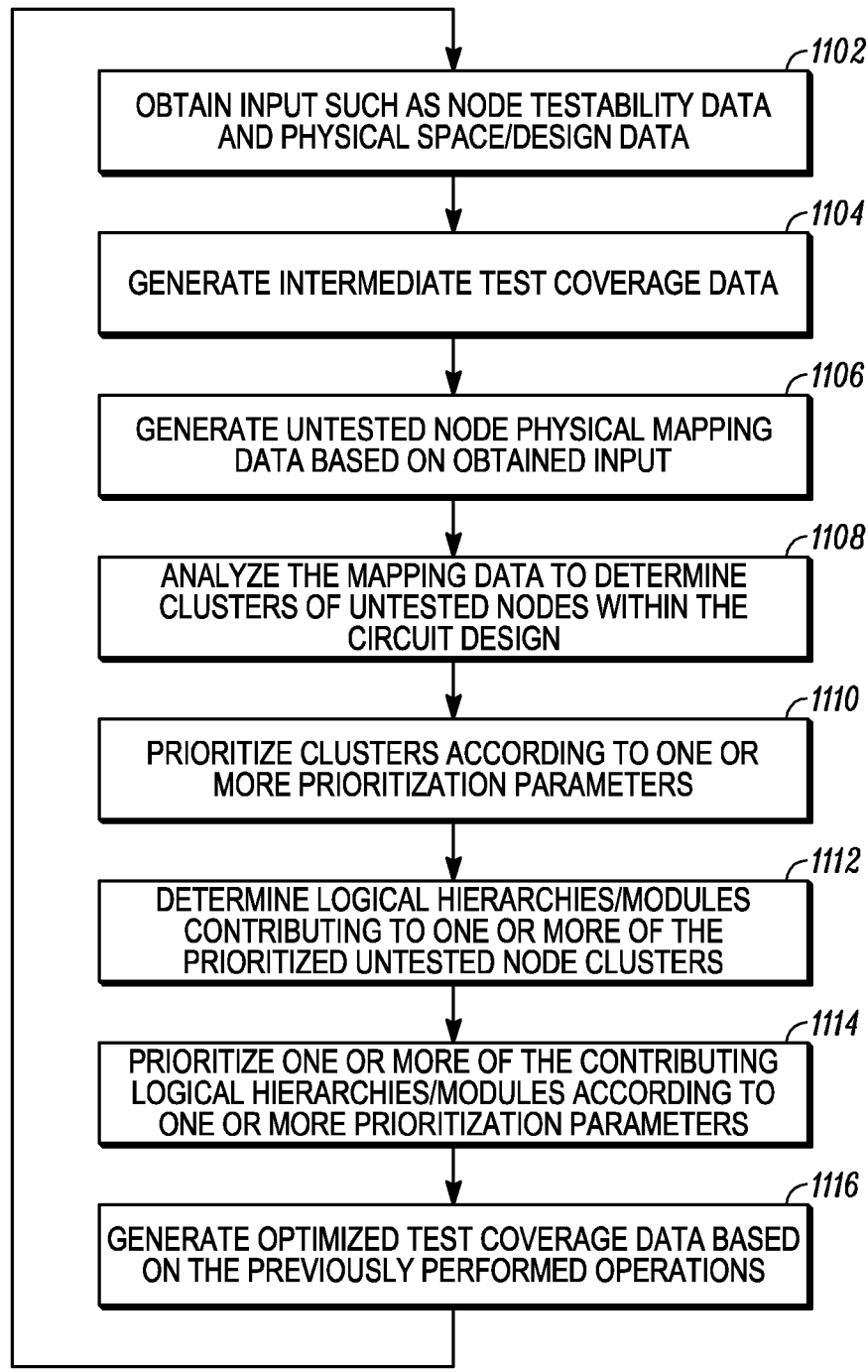
FIG. 11 is an operational flow diagram illustrating one example implementation of an overall process performed for determining areas of an integrated circuit design comprising test coverage gaps according to one embodiment of the present invention.

As discussed above, the low-test coverage identifier 720 optimizes test coverage performed by various testing tools 716 for an integrated circuit design by identifying areas within the design that are not adequately covered by the tests. Stated differently, the low-test coverage identifier 720 identifies areas of the design having low-test coverage or test coverage gaps. FIG. 11, in flow chart form, illustrates one example implementation of an overall process performed by the low-test coverage identifier 720 for determining areas of an integrated circuit design comprising test coverage gaps in accordance with some embodiments. The low-test coverage identifier 720 at block 1102 obtains input such as one or more sets of node testability data 734, 736, and physical space/design data 738 discussed above with respect to FIGS. 8 and 9.

The low-test coverage identifier 720 at block 1104 generates overall or intermediate test coverage data based on at least the one or more sets of node testability data 734, 736. The intermediate test coverage data 1008, in one embodiment, can be stored locally, stored remotely, and/or transmitted to one or more information processing systems such as a server or user device. In at least some embodiments, generation of the intermediate test coverage data 1008 is optional. FIG. 12 shows one example of overall/intermediate test coverage data 1200 according to one embodiment of the present invention. In this example, the intermediate test coverage data 1200 comprises data such as module identifier 1202, module name 1204, partition identifier 1206, detected node/fault count 1208, testable node/fault count 1210, test coverage measurement 1212, undetected node/fault count 1214, node/fault coverage measurement 1216 and total node/fault count 1218.

The module identifier 1202 comprises a unique identifier associated with a given module. This data, in one embodiment, is obtained from the node testability data 734, 736. The module name 1204 comprises a name associated with the given module. The partition identifier 1206 comprises a unique identifier associated with the partition comprising the given module. The detected node/fault count 1208 comprises the number of testable faults/nodes detected within the given module by the test associated with the node testability data 734, 736 used to generate the intermediate test coverage data 1200. The testable node/fault count 1210 comprises the number of testable nodes within the given module. The number of testable nodes/faults can be determined by subtracting the number of untestable nodes/faults from the total number of nodes/faults. The test coverage measurement 1212 indicates the amount of test coverage measured for the given module based on a ratio of the detected node/fault count 1208 and the testable node/fault count 1210. The undetected node/fault count 1214 comprises the number of nodes/faults within the given module that was not tested. The node/fault coverage measurement 1216 indicates the amount of node/fault coverage measured for the given module based on a ratio of the detected node/fault count 1208 and the total number of nodes/faults 1218 in the given module. Consider a first entry 1220 for the intermedia test coverage data 1200. In this example, the first entry 1220 shows Module_A has a hierarchy/module identifier of "1", a partition identifier of "1", a total of 822,167 detected nodes, a total of 860,554 testable nodes, a total test coverage of 95.54%, a total of 38,387 undetected nodes, a fault coverage of 95.08%, and a total of 864,678 faults. For example, Module_A comprises many nodes Node_1 to Node_X, as shown in FIGS. 8 and 9. The combination of all of these nodes summate together to produce the numbers shown in the DETECTED and UNDETECTED columns 1208, 1214 of the test coverage data 1200, and are utilized to identify the percentage of coverage for the respective Module_A.

Referring back to FIG. 11, the low-test coverage identifier 720 at block 1106 further utilizes the one or more sets of node testability data 734, 736 and physical space/design data 738 to generate mapping data 1010 identifying the physical location data of each identified untested node on the die/chip and to also generate one or untested node maps 1012. In more detail, the physical mapping data generator 1002 of the low-test coverage identifier 720 can analyze the node testability data 734, 736 to determine any nodes that were untested such as Node_975000. In one example, the physical mapping data generator 1002 determines that Node_975000 is untested based on the node testability data 734. Therefore, the physical mapping data generator 1002 analyzes the physical space data 738 to determine the physical location of Node_975000 on the die/chip. In this example, the physical mapping data generator 1002 determines that Node_975000 is located at die/chip x-coordinate XBD and y-coordinate YBD. The physical mapping data generator 1002, in this example, can also determines Module_ABC_2 comprising Node_975000 is located at die/chip x-coordinates XBB to XBN and y-coordinates YBC to YBE, and further determines that the instance Inst_XY comprising Node_975000 is located at die/chip x-coordinates XBB to XBG and y-coordinates YBC to YBE.

The physical mapping data generator 1002 stores the determined location data as mapping data 1010 in local and/or remote storage and, in at least one embodiment, utilizes this data 1010 to generate one or untested node maps 1012. The untested node maps 1012, in one embodiment, visually represent one or more untested nodes at the corresponding physical location on the die/chip. In some embodiments, the physical mapping data generator 1002 can generate the untested node maps 1012 directly from the node testability data 734, 736 and the physical space/design data 738 with needing to first generate the mapping data 1010. The untested node map 1012 can be stored locally, stored remotely, and/or transmitted to one or more information processing systems such as a server or user device.

Figure 13:
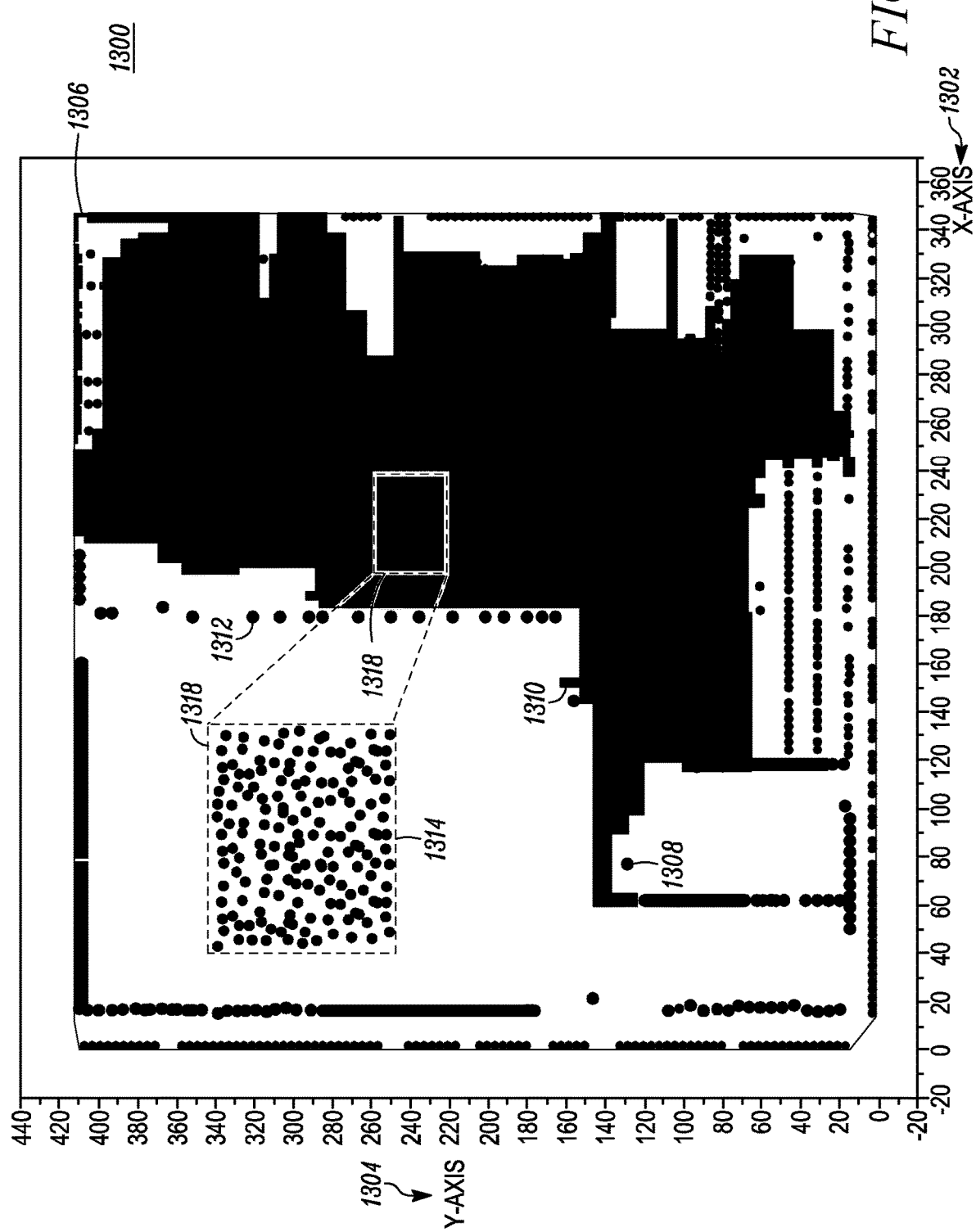
FIG. 13 illustrates one example of a map illustrating physical locations of untested nodes for a circuit design according to one embodiment of the present invention.

FIG. 13 shows one example of an untested node map 1300 generated by the physical map generator 1002 based on node testability data 734, 736 and physical space data 738. In this example, the map 1300 comprises an X-axis 1302 and a Y-axis 1304, each including a coordinate scale such as micrometers, nanometers, etc. The map 1300 further comprises an outline 1306 defining the boundaries of the die/chip. Untested nodes, such as nodes 1308 to 1314, are represented as, for example, solid circles/blobs at their physical location on the die/chip, while areas that are 100% tested are unfilled/unshaded (e.g., white) areas. For example, if labeled node 1308 represents Node_975000 from the node testability data 734, 736, then node 1308 can be shown in the map 1300 as a solid circle at x-coordinate XBD and y-coordinate YBD based.

It should be understood that in the example shown in FIG. 13, the solid shaded areas are a result of the illustrated map viewing level and the distribution density of the untested nodes. If the map 1300 is zoomed into, the separation (if any) between untested nodes becomes more evident. For example, a zoomed-in view 1316 of an area 1318 of the die/chip is shown where individual nodes 1314 are more clearly visible. When the untested node map 1300 is being presented to a user, the user is able to zoom in or out of the map to change the viewing level.

In at least one embodiment, one or more of the displayed nodes 1308 to 1314 are selectable to present additional information to the user. For example, the identifier of the selected node, the location information of the selected node, the identifier of the module comprising the node, the location information of the module, the identifier of the instance comprising the node, the location information of the instance, and/or combination thereof, can be displayed to the user responsive to the user selecting the node. In one example, a window (not shown in FIG. 13) can be presented to the user comprising the aforementioned information. In some embodiments, responsive to a user selecting a node, areas on the map 1300 representing the modules and/or instances comprising the selected nodes can be highlighted. It should be understood that embodiments are not limited to the representation of an untested node map illustrated in FIG. 13, and other methods/techniques for representing an untested node map are applicable as well. Also, the data presented in the untested node map 1300 can be filtered to only show untested nodes of interest. For example, nodes being untestable for a specific reason (e.g., specific architectural limitations) and modules having a specific function can be filtered out and not represented in the untested node map 1300.

Referring back to FIG. 11, the low-test coverage identifier 720 utilizes the mapping data 1010 (including any generated maps 1012) to identify low node test coverage areas of the circuit design. For example, the physical map analyzer 1004 at block 1108 analyzes the mapping data 1010 and/or untested node map(s) 1012 to determine clusters of untested nodes. A cluster of untested nodes, in one embodiment, is defined as two or more untested nodes located within a defined area at given distance from each other or from a central node. A cluster of untested nodes may reside within the same module or submodule or may be distributed across multiple modules and/or submodules. Clustered nodes are of interest because a close grouping of untested nodes increases the probability of test coverage for the area comprising the clustered nodes being inaccurate when determined by conventional test coverage mechanisms. Also, when analyzing test coverage from a physical perspective rather than a conventional module/hierarchical perspective, physical clustering of untested allows for the low-test coverage identifier 720 to determine low coverage physical points. Data 1014 associated with untested node clusters, in one embodiment, can be stored locally, stored remotely, and/or transmitted to one or more information processing systems such as a server or user device. Examples of data included within the untested node cluster data 1014 include a unique identifier for one or more clusters; physical location data associated with one or more clusters such as a range of coordinates; an identification of one or untested more nodes within a given cluster; untested node count for a cluster; and physical location data associated with each node such as a range of coordinates. The clustering operations performed at block 1108 are discussed in further detail with respect to FIGS. 14 and 15.

Once clusters of untested nodes and their locations on the die/chip have been determined, the cluster prioritizer 1006 at block 1110 prioritizes the clusters according to one or more prioritization parameters. In one embodiment, the cluster prioritizer 1006 prioritizes clusters based on, for example, the number of untested nodes (e.g., density) within the clusters, standard deviations associated with the density of untested nodes in the clusters and/or a combination thereof. In one example, clusters having a higher density of untested nodes, a higher number of contributing modules/submodules, a higher standard deviation and/or a combination thereof, are designated as a higher priority over clusters having a lower density of untested nodes, contributing modules/submodules, standard deviation, etc. Priority data and/or designations associated with one or more clusters can be stored as part of the untested node cluster data 1014 and/or separately as cluster prioritization data 1016. It should be understood that embodiments of the present invention are not limited to the prioritizing parameters or criteria discussed herein.

Figure 14:
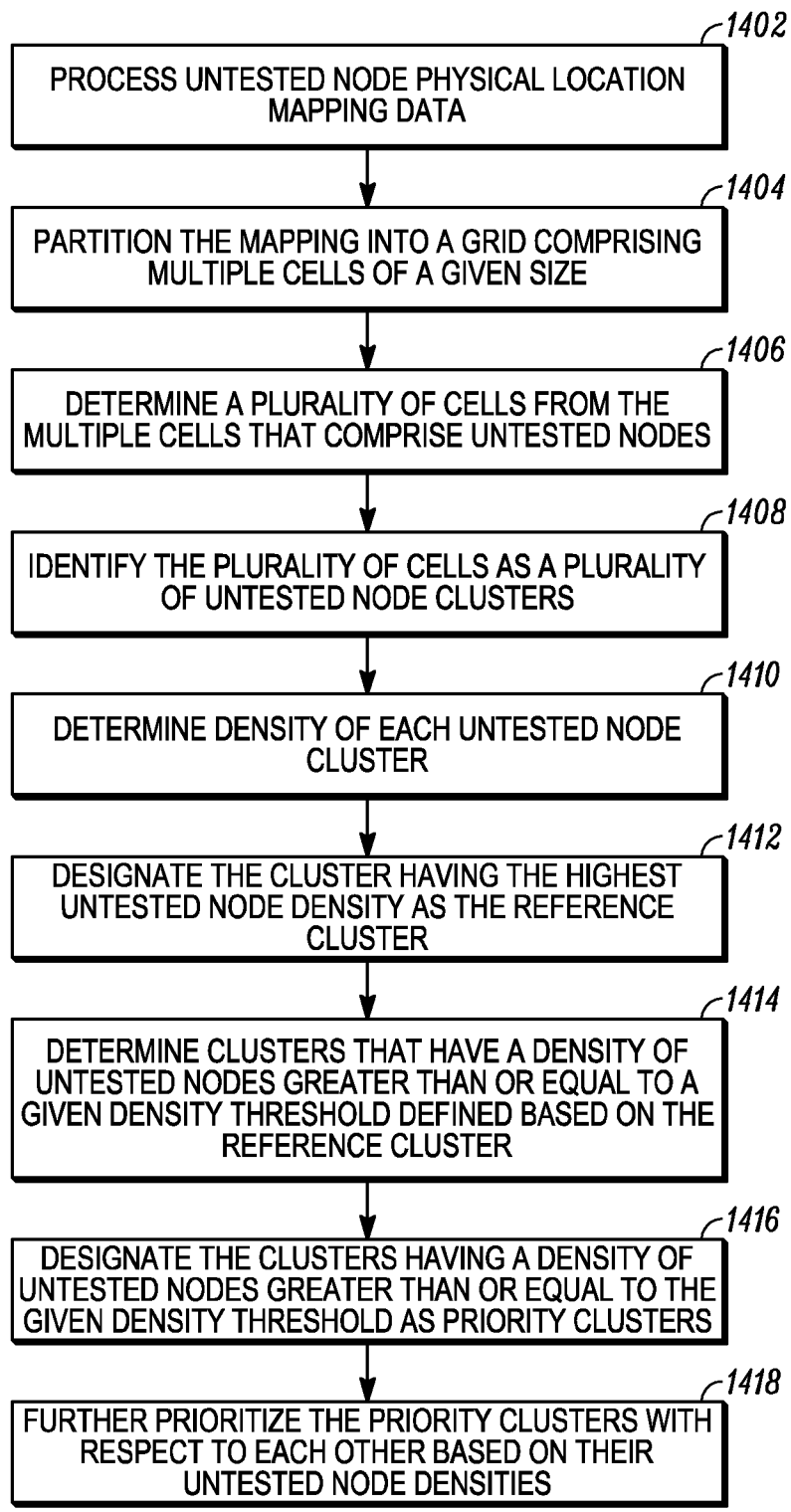
FIG. 14 is an operational flow diagram illustrating one example implementation of a process for performed for determining clusters of untested nodes and prioritizing the clusters according to one embodiment of the present invention.

FIG. 14, in flow chart form, illustrates one example implementation of a process performed by the low-test coverage identifier 720 for clustering areas of untested nodes and prioritizing the untested node clusters. The physical map analyzer 1004 of the low-test coverage identifier 720 at block 1402 processes the mapping data 1010 and/or untested node map(s) 1012. The physical map analyzer 1004 at block 1404 partitions the mapping data 1010/1012 into a grid comprising multiple cells of a given size. The physical map analyzer 1004 at block 1406 determines a plurality of cells from the multiple cells that comprise untested nodes. The physical map analyzer at block 1408 identifies the plurality of cells as a plurality of untested node clusters. Once the clusters have been identified, the cluster prioritizer 1006 of the low-test coverage identifier 720 at block 1410 determines the density of each untested node cluster. The cluster prioritizer 1006 at block 1412 designates the highest density cluster as a reference cluster. The cluster prioritizer 1006 at block 1414 determines clusters that have a density greater than or equal to a given density threshold that has been defined based on the reference cluster. The clusters identified by the cluster prioritizer 1006 at block 1414 are designated by the cluster prioritizer 1006 as priority clusters at block 1416. The priority clusters can be further prioritized with respect to each other based on their untested node densities at block 1418.

Figure 15:
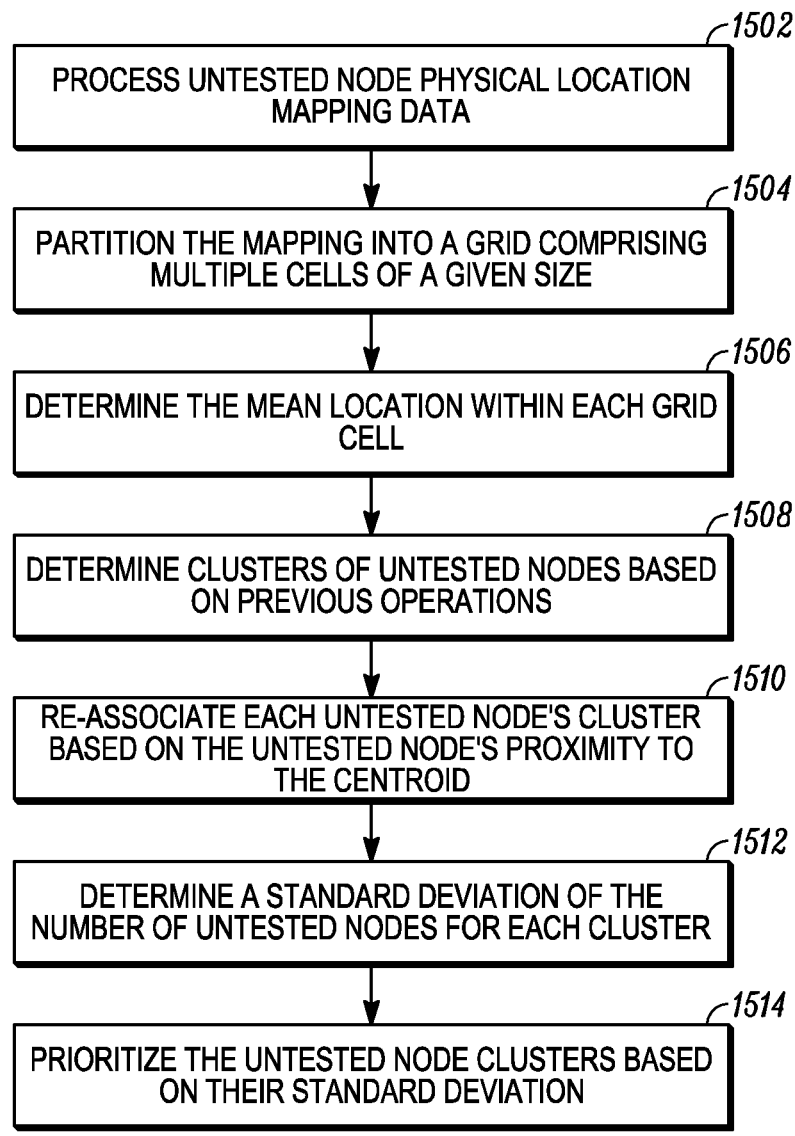
FIG. 15 is an operational flow diagram illustrating another example implementation of a process for performed for determining clusters of untested nodes and prioritizing the clusters according to one embodiment of the present invention.

FIG. 15, in flow chart form, illustrates another example implementation of a process performed by the low-test coverage identifier 720 for clustering areas of untested nodes and prioritizing the untested node clusters. The physical map analyzer 1004 of the low-test coverage identifier 720 at block 1502 processes the mapping data 1010 and/or untested node map(s) 1012. The physical map analyzer 1004 at block 1504 partitions the mapping data 1010/1012 into a grid comprising multiple cells of a given size. The physical map analyzer 1004 at block 1506 determines the mean location within each grid cell, where the mean location represents where the weight of the distribution lies, i.e., the centroid. The physical map analyzer 1004 at block 1508 re-associates each untested node's cluster based on the untested node's proximity to the centroid. The physical map analyzer 1004, in at least one embodiment, performs the operations at blocks 1506 and 1508 a number of times, e.g., three times. The physical map analyzer 1004 at block 1510 determines a plurality of untested node clusters based on the operations performed at blocks 1506 and 1508.

Once the clusters have been identified, the cluster prioritizer 1006 of the low-test coverage identifier 720 at block 1512 determines a standard deviation of the number of untested nodes for each cluster of the plurality of clusters based on a uniform distribution of a total number of untested nodes across the plurality of clusters. The cluster prioritizer 1006 at block 1514 then prioritizes the untested node clusters based on their standard deviation. For example, if the design includes 20,000,000 untested nodes, and the mapping data is divided into a grid of two hundred cells, then each grid can be expected to have 100,000 untested nodes following a uniform distribution. The cluster prioritizer 1006, in this example, identifies clusters having a 2.5-sigma or higher standard deviation from the 100,000 untested nodes, clusters having a standard deviation between 1.5-sigma and 2.5-sigma, and clusters having a standard deviation between 0.5-sigma and 1.5-sigma. The clusters having a 2.5-sigma or higher standard deviation are assigned the highest priority, while the clusters having a standard deviation between 0.5-sigma and 1.5-sigma are assigned the lowest priority.

In at least one embodiment, the low-test coverage identifier 720 implements one or more machine learning techniques to improve/optimize the cluster identification and prioritization processes performed by the low-test coverage identifier 720. For example, the size of the grid cells, the density threshold, the number of iterations to perform each block, and the standard deviation values used for prioritization can be automatically updated by the low-test coverage identifier 720 based different executions of the cluster identification and prioritization processes. One example implementing machine learning includes utilizing prior historical data based off multiple runs of a tool using a sweep of parameter values to perform machine learning and establishing the most effective return of clusters based off a given set of parameters. These parameters could also be modified by bringing in other data analysis points such as product return data that could highlight problem areas, and then use the parameter sweeping to determine the most effective set of parameters for a given design. Also, modules that historically cause more issues than other modules can be given a higher weight when determining how to prioritized modules for the optimized test coverage data 740.

Referring back to FIG. 11, in addition to prioritizing the untested node clusters, the low-test coverage identifier 720 can also prioritize the modules contributing to each cluster. For example, the low-test coverage identifier 720 at block 1112 determines the logical modules contributing to one or more of the prioritized untested node clusters. In at least one embodiment, a logical module contributes to a cluster if an untested node within the module is part of the cluster. In one embodiment, the low-test coverage identifier 720 analyzes the untested node cluster data 1014 (or any other dataset); the node testability data 734, 736; the physical space/design data 738; and/or a combination thereof; to determine the logical modules that contribute a given untested node cluster. For example, low-test coverage identifier 720 compares the identifier of a node within a given cluster to the node identifiers associated with each module to determine if the node is part of the module. In another example, the low-test coverage identifier 720 compares physical location data of a module with the physical location data of the cluster and/or each node within the cluster to determine if at least a portion of the module is located within the cluster and to also determine the particular nodes associated with the portion of the module located within the cluster. The low-test coverage identifier 720 can then update the untested node coverage data 1014 to include module identifier data for a given cluster, module count for the given cluster, and/or the like.

The low-test coverage identifier 720 at block 1114 prioritizes one or more of the contributing logical modules identified at block 1112 according to one or more prioritization parameters. In one embodiment, module prioritization is performed on a per-cluster basis and based on the number of untested nodes within each module contributing to the cluster. Consider one example where Module_1, Module_2, and Module_3 each contribute to Cluster_1. In this example, Module_1 comprises 7,500 untested nodes within Cluster_1, Module_2 comprises eight hundred (800) untested nodes within Cluster_1, and Module_3 comprises 1,500 untested nodes within Cluster_1. The low-test coverage identifier 720, in at least one embodiment, considers modules having a higher number of untested nodes in the cluster as a higher priority over modules having a lower number of untested nodes in the cluster because the probability of defects occurring increases as the number of untested nodes increases in a given area, i.e., cluster. Therefore, in this example, the low-test coverage identifier 720 determines that Module_1 is the highest priority module for Cluster_1, Module_2 is the next highest priority module for Cluster_1, and Module_3 is the lowest priority module for Cluster_1. Priority data and/or designations associated with one or more logical modules can be stored as part of the untested node cluster data 1014 and/or separately as logical module prioritization data 1018.

The low-test coverage identifier 720 at block 1116 generates optimized test coverage data 740 based on the previously generated data such as the intermediate test coverage data 1008, mapping data 1010, untested node map(s) 1012, untested node clustering data 1014, cluster prioritization data 1016, module prioritization data 1018 and/or a combination thereof. The low-test coverage identifier 720, in at least one embodiment, is considered optimized because this data was generated utilizing both node testability data 734, 736 and physical space data 738 to identify areas of the design comprising low-test coverage that is not typically identified by conventional test analysis tools.

Figure 16:
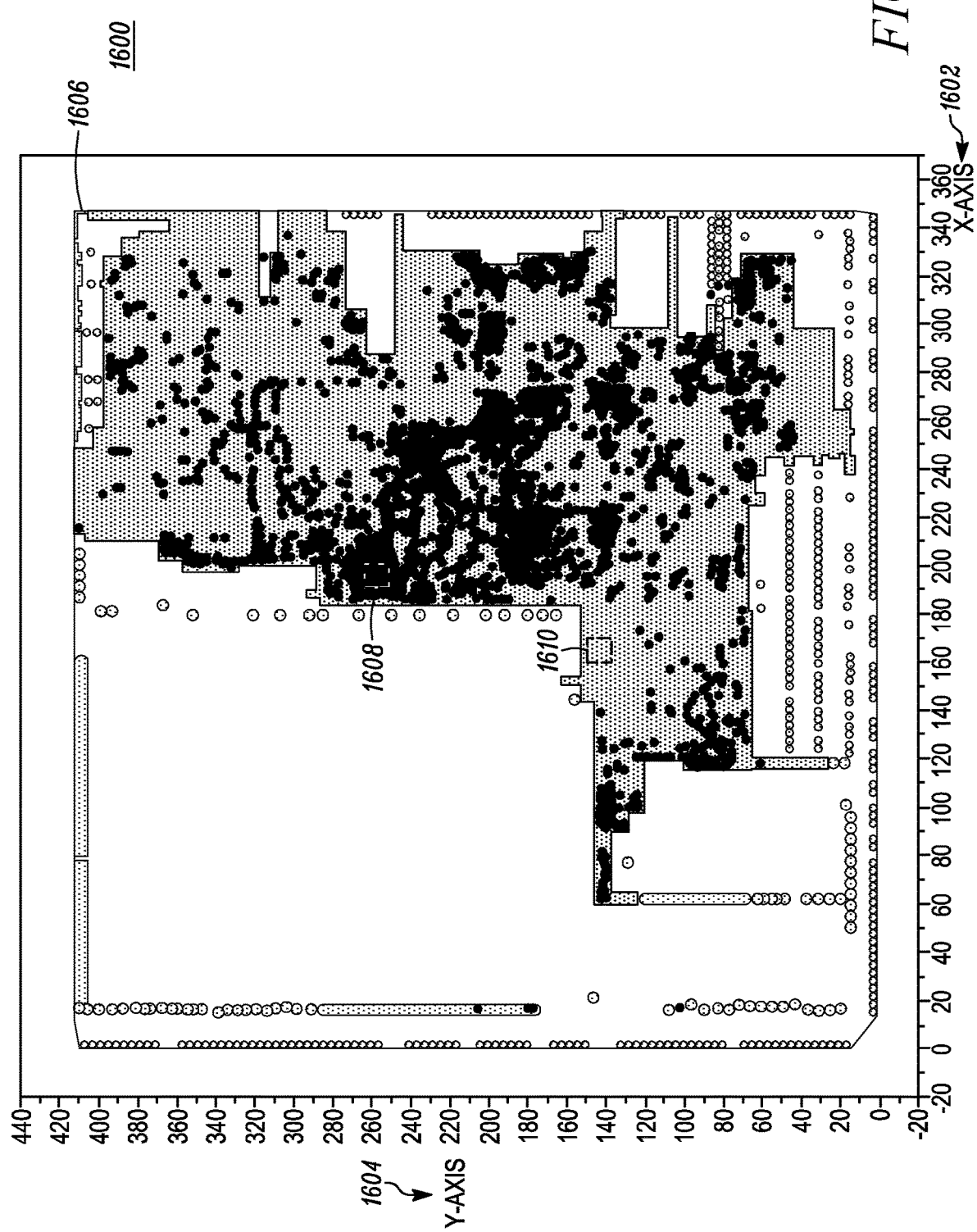
FIG. 16 illustrates one example of an updated map illustrating a top-N percent of untested node clustered areas in the circuit design according to one embodiment of the present invention.

The low-test coverage identifier 720, in at least one embodiment, can generate the optimized test coverage data 740 in various forms. For example, in at least one embodiment, the low-test coverage identifier 720 utilizes one or more of the generated sets of data 1008 to 1018 to update the mapping data 1010 and/or generate additional untested node maps 1012. For example, the untested node map 1300 shown in FIG. 13 can be updated to visually highlight areas comprising priority clusters and/or modules. For example, FIG. 16 shows one example of an updated untested node map 1600. In this example, the map 1300 has been updated to highlight the top-N percent of untested node clustered areas in the design. In this example, the map 1600 comprises an X-axis 1602 and a Y-axis 1604, each including a coordinate scale such as micrometers, nanometers, etc. In this example, the top-N percent of untested node clustered areas are visually represented in a different manner to distinguish these areas from the remaining untested node clustered areas. For example, the top-N percent of untested node clustered areas, as areas 1608, are represented as black shaded areas, whereas the remaining clustered areas, such as area 1610, are represented as areas having a different shading intensity.

Figure 17:
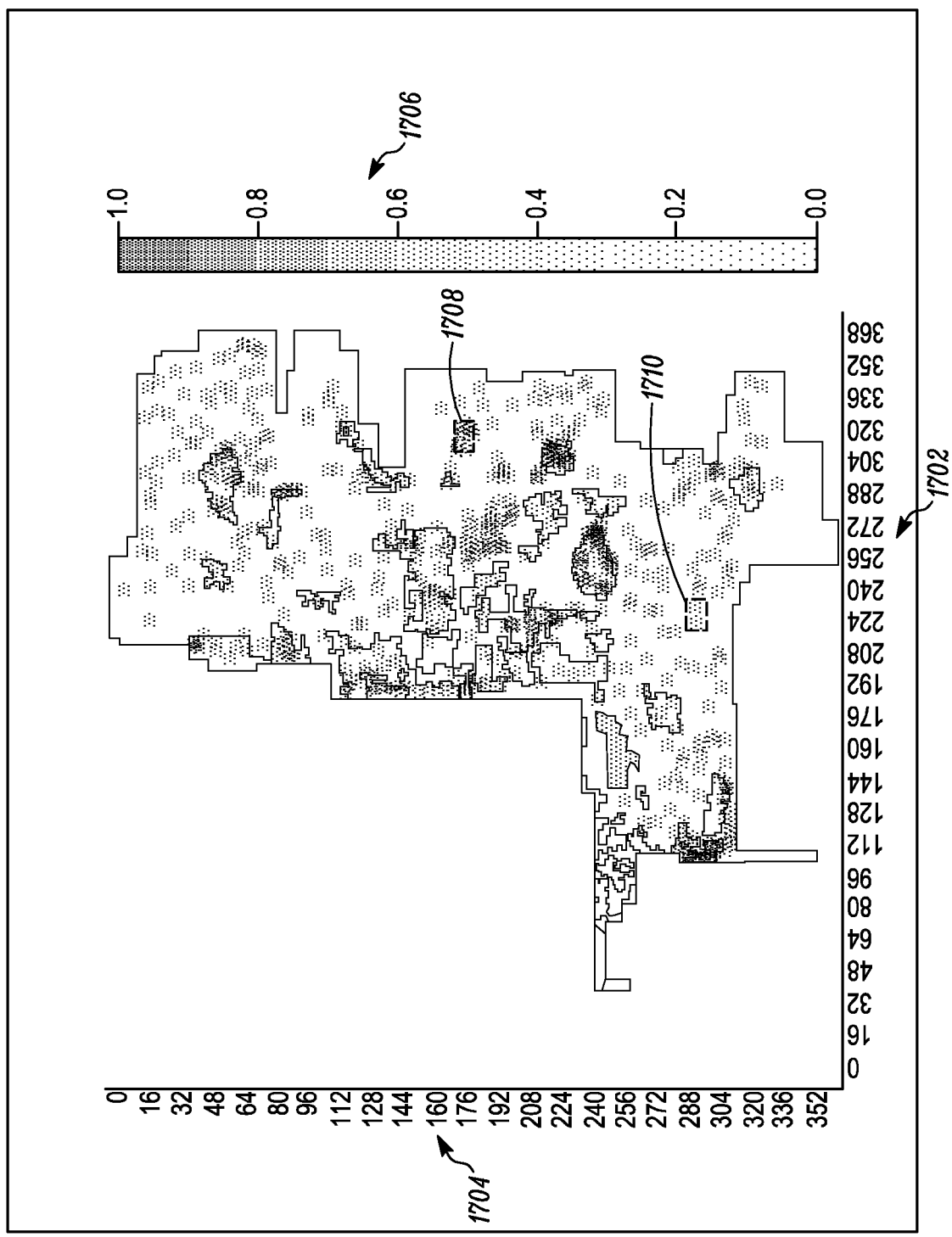
FIG. 17 illustrates one example of a heat map representing areas of the circuit design having different densities of untested nodes according to one embodiment of the present invention.

FIG. 17 shows another example of a map 1700 generated by the low-test coverage identifier 720 based on the cluster data 1014, cluster prioritization data, module prioritization data 1018, a combination thereof, and/or the like. In this example, the map 1700 is a "heat" map that visually distinguishes areas of untested nodes having a different number of untested nodes and/or different priorities. The map 1700 comprises an X-axis 1702 and a Y-axis 1704, each including a coordinate scale such as micrometers, nanometers, etc. The map 1700 further comprises an untested node density scale 1706. In this example, areas having a higher number of clustered untested nodes or a higher priority are shaded with a darker intensity than areas having a lower number of clustered untested nodes or a lower priority. For example, area 1708 is shaded with a darker intensity than area 1710 because area 1708 has a greater density of untested nodes. Similar to the untested node map 1300 discussed with respect to FIG. 13, the maps 1600, 1700 of FIGS. 16 and 17 can also be interactive maps that display addition data to users when different areas of the maps are selected. For example, a window (not shown in FIG. 13) can be presented to the user comprising the aforementioned information. In some embodiments, responsive to a user selecting a node, areas on the maps 1600, 1700 representing the modules and/or instances comprising the selected nodes can be highlighted.

FIG. 18 shows one additional example of optimized test coverage data 1800. In an example illustrated in FIG. 18, the optimized test coverage data 1800 comprises cluster priority data 1802, cluster identifier data 1804, undetected nodes/faults data 1806, modules and contribution data 1808, cluster location data 1810, and/or the like. However, other types of data are applicable as well and one or more of the illustrated data types can be removed and/or one or more different data types can be added.

The cluster identifier data 1802 comprises the unique identifier associated with the corresponding cluster. The cluster priority data 1804 comprises a priority assigned to the cluster by the low-test coverage identifier 720, according to one or more operations discussed above. The undetected nodes/faults data 1806 comprises the total number of undetected nodes/faults in the cluster. The modules data 1808 comprises the identifier of each module contributing to the cluster. In another example, the identifiers for a given number of the highest priority modules are included in the modules data 1808. The modules data 1808, in one embodiment, also comprises the number of untested nodes/faults contributed to the cluster by each module. The cluster location data 1810 comprises physical location data of the clusters, such as coordinates on the die/chip. In at least one embodiment, consider a first entry 1812 in the optimized test coverage data 1800. This entry shows that a cluster with cluster identifier "0" has a cluster priority of "1" (with "1" being the highest priority), a total number of 500,000 undetected or untested nodes/faults, and is located on the die/chip at Location_1. The first entry 1812 also shows that modules Module_A, Module_AB_4, . . . , Module_BB each contribute untested to this cluster, where Module_A contributed 7,000 untested nodes, Module_AB contributed 2,000 untested nodes, and Module_BB contributed 1,000 untested nodes.

FIG. 19 shows a further example of optimized test coverage data 1900. In this example, the optimized test coverage data 1900 comprises data associated with one or more of the modules of the design and one or more clusters associated with the modules. The low-test coverage identifier 720, in at least one embodiment, can obtain module data from the intermediate test coverage data 1008, the untested node cluster data 1014, the module prioritization data 1018, directly from the node testability data 734, 736, the physical space data 738, a combination thereof, and/or the like.

In one example, the optimized test coverage data 1900 of FIG. 19 includes module data 1902, test coverage measurement 1904, total node/fault data 1906, node/fault coverage measurement 1908, undetected node/fault data 1910, and clustered untested node/fault data 1912. In the example shown in FIG. 19, data associated with the top-N overall contributing logical modules are shown, wherein the overall contribution of a logical module is determined based on the total number of untested nodes contributed by the module for all untested node clusters associated with the module, or based on the total number of untested nodes contributed by the module for a given number of the highest priority untested node clusters.

The module data 1902 comprises, for example, an identifier of the given module, the name of the module, and/or the like. The test coverage measurement 1904 indicates the amount of test coverage measured for the given module based on a ratio of the detected node count 1208 (see FIG. 12) and the testable node count 1210 for the module. The total fault data 1906 comprises the total number of nodes/faults 1218 in the given module. The node/fault coverage measurement 1908 indicates the amount of node/fault coverage measured for the given module based on a ratio of the detected node count 1208 and the total number of nodes 1218 in the given module. The undetected node/fault data 1910 comprises, for example, the number of nodes/faults within the given module that were not tested. The clustered untested node/fault data 1912 comprises, for example, the total number of nodes/faults contributed by the module to all untested node clusters associated with the module to a given number of the highest priority untested node clusters.

Consider a first entry 1914 in the optimized test coverage data 1900. This entry shows module Module_A has an overall test coverage of 95.54%, a total of 864,674 nodes/faults, a total fault coverage of 95.08%, a total of 38,387 untested (undetected) nodes/fault and contributed a total of 10,000 untested/nodes faults to one or more untested node clusters. When this data is analyzed by a testing tool and/or by a designer, a determination can be made that even though the overall test coverage is 95.54%, which is generally acceptable under current industry standards, the number of clustered nodes associated with this module is high when compared to other modules. Therefore, the design tool and/or designer is able to determine that the design/manufacturing test(s) and/or design for this module needs to be revised to increase test coverage for this module even though the total fault coverage is within acceptable limits.

Referring back to FIG. 11, after the optimized test coverage data 740 has been generated, the flow returns to block 1102, where the low-test coverage identifier 720 waits to receive new input for repeating the operations discussed above with respect to blocks 1104 to 1116. The test coverage optimization processes may be repeated numerous times after additional stimuli that exercise more nodes than previously may have been done to generate new node testability data 734, 736. After the logical and physical designs/tests of the chip have been revised based on the optimized test coverage data 740 and all design requirements have been satisfied, the optimized design is sent to the fabrication system 704 for fabrication of the designed chip.

Figure 20:
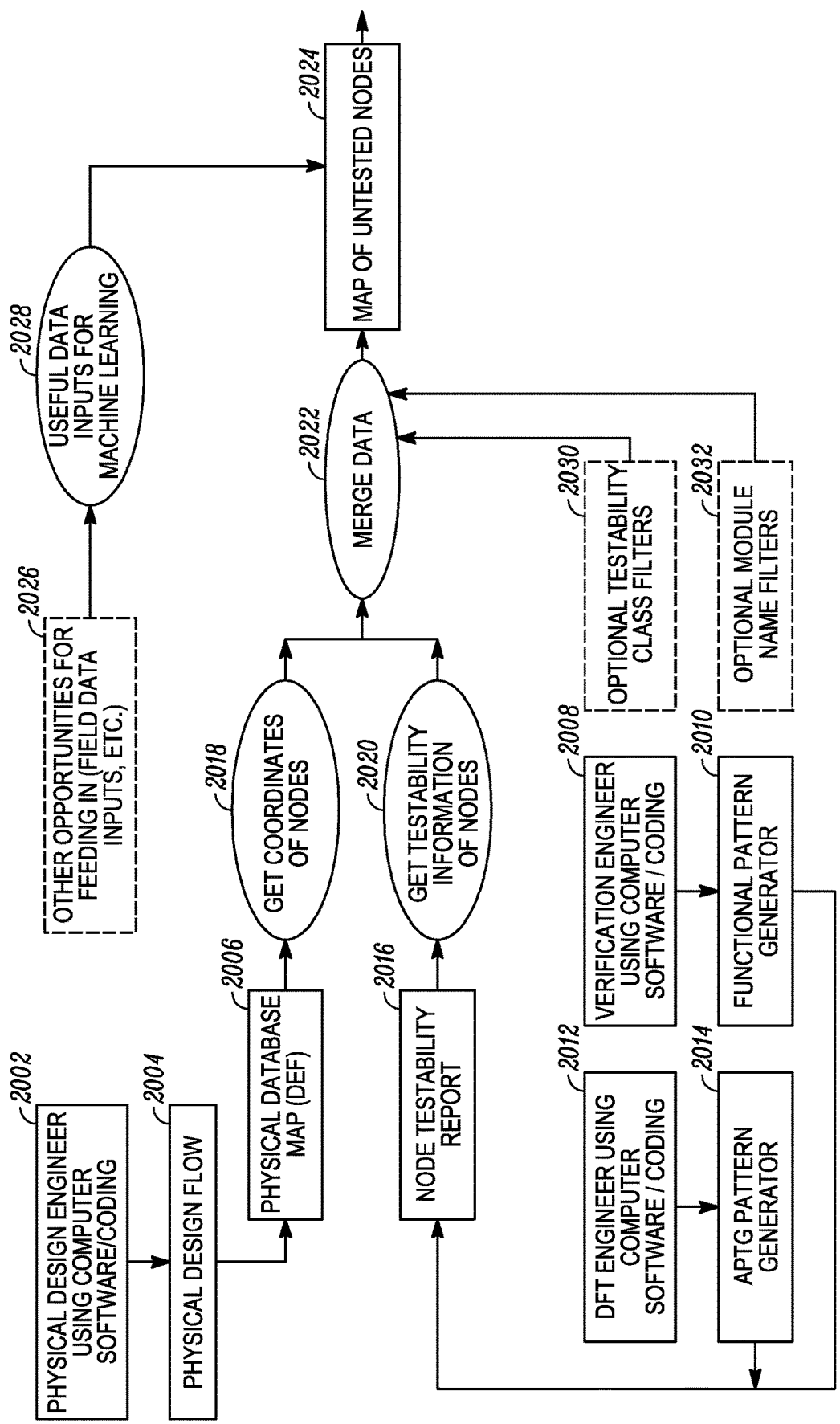
FIG. 20 is an operational flow diagram illustrating another example implementation of an overall process performed for determining areas of an integrated circuit design comprising test coverage gaps according to one embodiment of the present invention.

FIG. 20, in flow chart form, illustrates another example implementation of an overall process performed by the low-test coverage identifier 720 for determining areas of an integrated circuit design comprising test coverage gaps in accordance with some embodiments. A designer and/or a design tool at block 2002 performs one or more design operations and implements a physical design flow at block 2004. A physical database map at block 2006 is generated. Also, a verification engineer and/or a verification tool at block 2008 and a functional pattern generator at block 2010 perform one or more operations. A design-for-test engineer and/or a design-for-test tool at block 2012 and an automatic test pattern generator at block 2014 perform one or more operations. The operations performed at blocks 2008 to 2014 generate one or more sets of node testability reports at block 2016.

The low-test coverage identifier 720 at block 2018 obtains the physical database map and determines coordinates of nodes within the circuit design. The low-test coverage identifier 720 at block 2020 obtains the node testability report(s) and determines testability information of the nodes within the circuit design. The low-test coverage identifier 720 at block 2022 merges the coordinate and testability data to generate a map of untested nodes at block 2024. In some embodiments, other opportunities for feeding in additional inputs at block 2026 exist that can be utilized as inputs for machine learning at block 2028 during the generation of untested node maps. Also, optional testability class filters at block 2030 and optional module name filters at block 2032 can be utilized during the merge data operations at block 2022.

Figure 21:
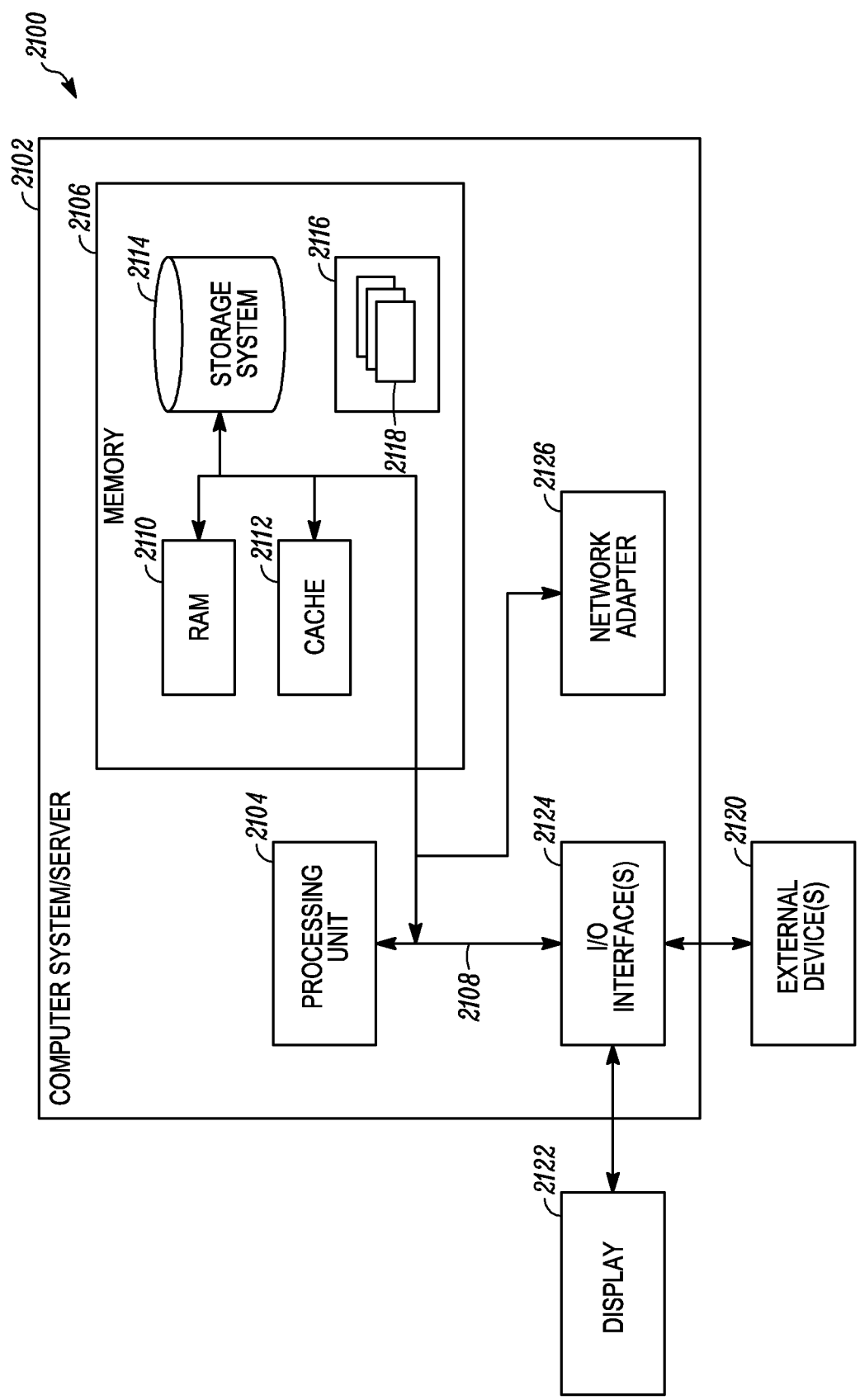
FIG. 21 is a diagram illustrating one example of an information processing system according to one embodiment of the present invention.

FIG. 21 is a block diagram illustrating an information processing system 2100 that can be utilized by one or more embodiments discussed herein. The information processing system 2102 is based upon a suitably configured processing system configured to implement one or more embodiments of the present invention, such as the information processing system 732 of FIG. 7. Any suitably configured processing system, including specialized processing systems, can be used as the information processing system 2102.

The components of the information processing system 2102 can include but are not limited to, one or more processors or processing units 2104, a system memory 2106, and a bus 2108 that couples various system components including the system memory 2106 to the processor 2104. The bus 2108 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

Although not shown in FIG. 21, the main memory 2106 includes the low-test coverage identifier 720. The low-test coverage identifier 720 can also reside within the processor 2104, or be a separate hardware component. The system memory 2106 can also include computer system readable media in the form of volatile memory, such as random access memory (RAM) 2110 and/or cache memory 2112. The information processing system 2102 can further include other removable/non-removable, volatile/non-volatile computer system storage media. By way of example only, a storage system 2114 can be provided for reading from and writing to a non-removable or removable, non-volatile media such as one or more solid-state disks and/or magnetic media (typically called a "hard drive"). A magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to the bus 2108 by one or more data media interfaces. The memory 2106 can include at least one program product having a set of program modules that are configured to carry out the functions of an embodiment of the present disclosure.

Program/utility 2116, having a set of program modules 2118, may be stored in memory 2106 by way of example, and not limitation, as well as an operating system, one or more application programs, other program modules, and program data. Each of the operating system, one or more application programs, other program modules, and program data or some combination thereof, may include an implementation of a networking environment. Program modules 2118 generally carry out the functions and/or methodologies of embodiments of the present disclosure.

The information processing system 2102 can also communicate with one or more external devices 2120 such as a keyboard, a pointing device, a display 2122, etc.; one or more devices that enable a user to interact with the information processing system 2102; and/or any devices, e.g., network card, modem, etc., that enable computer system/server 2102 to communicate with one or more other computing devices. Such communication can occur via I/O interfaces 2124. Still yet, the information processing system 2102 can communicate with one or more networks such as a local area network (LAN), a general wide area network (WAN), and/or a public network, e.g., the Internet, via network adapter 2126. As depicted, the network adapter 2126 communicates with the other components of the information processing system 2102 via the bus 2108. Other hardware and/or software components can also be used in conjunction with the information processing system 2102.

The term "coupled", as used herein, is defined as "connected" and encompasses the coupling of devices that may be physically, electrically or communicatively connected, although the coupling may not necessarily be directly and not necessarily be mechanical. The term "configured to" describes hardware, software, or a combination of hardware and software that is adapted to, set up, arranged, built, composed, constructed, designed, or that has any combination of these characteristics to carry out a given function. The term "adapted to" describes hardware, software, or a combination of hardware and software that is capable of, able to accommodate, to make, or that is suitable to carry out a given function.

The terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The term "coupled", as used herein, is not intended to be limited to a direct coupling or a mechanical coupling, and that one or more additional elements may be interposed between two elements that are coupled.

As will be appreciated by one skilled in the art, aspects of the present disclosure may be embodied as a system, method, or computer program product. Accordingly, aspects of the present disclosure may take the form of an entirely hardware embodiment, an entirely software embodiment (including firmware, resident software, micro-code, etc.) or an embodiment combining software and hardware aspects that may all generally be referred to herein as a "circuit" or "system".

The invention may be a system, a method, and/or a computer program product. The computer program product may include a computer-readable storage medium (or media) having computer readable program instructions thereon for causing a processor to carry out aspects of the invention.

In one embodiment, the computer program product includes a non-transitory storage medium readable by a processing circuit and storing instructions for execution by the processing circuit for performing a method. The computer-readable storage medium can be a tangible device that can retain and store instructions for use by an instruction execution device. The computer-readable storage medium may be, for example, but is not limited to, an electronic storage device, a magnetic storage device, an optical storage device, an electromagnetic storage device, a semiconductor storage device, or any suitable combination of the foregoing. A computer-readable storage medium, as used herein, is not to be construed as being transitory signals per se, such as radio waves or other freely propagating electromagnetic waves, electromagnetic waves propagating through a waveguide or other transmission media, e.g., light pulses passing through a fiber-optic cable), or electrical signals transmitted through a wire.

Computer-readable program instructions for carrying out operations of the invention may be assembler instructions, instruction-set-architecture (ISA) instructions, machine instructions, machine-dependent instructions, microcode, firmware instructions, state-setting data, or either source code or object code written in any combination of one or more programming languages, including an object-oriented programming language such as Smalltalk, C++, and conventional procedural programming languages, such as the "C" programming language or similar programming languages. The computer-readable program instructions may execute entirely or partly on a user's computer or entirely or partly on a remote computer or server. In the latter scenario, the remote computer may be connected to the user's computer through any type of network, including a local area network (LAN) or a wide area network (WAN), or the connection may be made to an external computer (for example, through the Internet). In some embodiments, electronic circuitry including, for example, programmable logic circuitry, field-programmable gate arrays (FPGA), or programmable logic arrays (PLA) may execute the computer-readable program instructions by utilizing state information of the computer-readable program instructions to personalize the electronic circuitry, in order to perform aspects of the invention.

Aspects of the invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer-readable program instructions may be provided to a processor of a general-purpose computer, special purpose computer, or other programmable data processing apparatus to produce a machine, such that the instructions, which execute via the processor of the computer, create means for implementing the functions/acts specified in the flowchart and/or block diagram blocks. These computer-readable program instructions may also be stored in a computer-readable storage medium that can direct a computer to function in a particular manner, such that the computer-readable storage medium having instructions stored therein comprises an article of manufacture including instructions which implement aspects of the function/act specified in the flowchart and/or block diagram block or blocks.

The description of the present disclosure has been presented for purposes of illustration and description but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application and to enable others of ordinary skill in the art to understand the invention for various embodiments with various modifications as are suited to the particular use contemplated.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the invention.

What is claimed is:

1. A method for determining test coverage for a circuit design, the method comprising:
   obtaining node testability data and physical location data for each node of a plurality of nodes in a circuit design;
   determining one or more low test coverage areas within the circuit design comprising untested nodes based on the node testability data and the physical location data of each node of the plurality of nodes;
   generating test coverage data for the circuit design comprising at least an identification of the one or more low test coverage areas, wherein generating the test coverage data includes:
   determining, based on the node testability data and the physical location data, at least one of a set of modules or a set of submodules of the circuit design within the one or more low test coverage areas, wherein the at least one of a set of modules or a set of submodules comprises the untested nodes; and
   including at least an identification of the at least one of a set of modules or a set of submodules in the test coverage data; and
   updating the circuit design based on the one or more low test coverage areas identified in the test coverage data, wherein updating the circuit design increases test coverage in at least one of the one or more low test coverage areas.

2. The method of claim 1, wherein determining one or more low test coverage areas comprises:
   identifying, based on at least the physical location data, a plurality of untested node clusters in one or more areas of the circuit design.

3. The method of claim 2, further comprising:
   prioritizing each untested node cluster of the plurality of untested node clusters based on at least a number of untested nodes within each untested node cluster.

4. The method of claim 3, further comprising:
   determining, for one or more of the prioritized untested node clusters, at least one of a set of modules or a set of submodules of the circuit design that contributes untested nodes to the one or more of the prioritized untested node clusters based at least one of the node testability data or the physical location data.

5. The method of claim 4, further comprising:
prioritizing the at least one of a set of modules or a set of submodules based on a number of untested nodes contributed to the one or more of the prioritized untested node clusters by the at least one of a set of modules or a set of submodules.

6. The method of claim 5, wherein generating the test coverage data comprises:
including within the test coverage data, at least one of
data associated with one or more of the prioritized untested node clusters of the plurality of untested node clusters; and
data associated with the prioritized at least one of a set of modules or a set of submodules.

7. The method of claim 1, wherein determining the one or more low test coverage areas comprises:
identifying a plurality of untested nodes within the circuit design based on the node testability data;
determining one or more areas of the circuit design comprising a cluster of untested nodes from the plurality of untested nodes based on the physical location data; and
identifying at least one of the one or more areas of the circuit design comprising a cluster of untested nodes as the one or more low test coverage areas.

8. The method of claim 7, wherein determining the one or more areas comprising the cluster of untested nodes comprises:
identifying groups of untested nodes from the plurality of untested nodes each satisfying one or more clustering criteria, wherein each group of untested nodes satisfying the one or more clustering criteria is determined to be a cluster of untested nodes.

9. The method of claim 7, wherein determining the one or more areas comprising the cluster of untested nodes comprises:
generating, based on at least the physical location data, mapping data associated with the circuit design, wherein the mapping data represents untested nodes from the plurality of untested nodes at a physical location within circuit design;
partitioning the mapping data into a grid comprising multiple cells of a given size; and
determining a plurality of cells from the multiple cells that comprise untested nodes; and
identifying the plurality of cells as a plurality of clusters.

10. The method of claim 9, further comprising:
determining a density of untested nodes within each cluster of the plurality of clusters;
designating a cluster from the plurality of clusters as a reference cluster based on the cluster having a highest density of untested nodes;
determining one or more clusters from the plurality of clusters comprise an untested node count that is greater than or equal to a threshold number of untested nodes based on the reference cluster; and
including data associated with the one or more clusters in the test coverage data.

11. The method of claim 9, further comprising:
determining a density of untested nodes within each cluster of the plurality of clusters;
determining a standard deviation of the density of untested nodes for each cluster of the plurality of clusters based on a uniform distribution of a total number of untested nodes across the plurality of clusters;
assigning a priority to each cluster of the plurality of clusters based on the standard deviation determined for the cluster; and
including data associated with one or more clusters of the plurality of clusters in the test coverage data based on the priority assigned to the one or more clusters.

12. An information processing system for determining test coverage for a circuit design, the information processing system comprising:
a processor;
a memory communicatively coupled to the processor; and
a test coverage analyzer communicatively coupled to the processor and the memory, wherein the test coverage analyzer is configured to:
obtain node testability data and physical location data for each node of a plurality of nodes in a circuit design;
determine one or more low test coverage areas within the circuit design comprising untested nodes based on the node testability data and the physical location data of each node of the plurality of nodes;
generate test coverage data for the circuit design comprising at least an identification of the one or more low test coverage areas by:
determining, based on the node testability data and the physical location data, at least one of a set of modules or a set of submodules of the circuit design within the one or more low test coverage areas, wherein the at least one of the set of modules or the set of submodules comprises the untested nodes; and
including at least an identification of the at least one of the set of modules or the set of submodules in the test coverage data; and
update the circuit design based on the one or more low test coverage areas identified in the test coverage data, wherein updating the circuit design increases test coverage in at least one of the one or more low test coverage areas.

13. The information processing system of claim 12, wherein the test coverage analyzer is configured to determine the one or more low test coverage areas by:
identifying, based on at least the physical location data, a plurality of untested node clusters in one or more areas of the circuit design.

14. The information processing system of claim 13, wherein the test coverage analyzer is further configured to:
prioritize each untested node cluster of the plurality of untested node clusters based on at least a number of untested nodes within each untested node cluster;
determine, for one or more of the prioritized untested node clusters, at least one of a set of modules or a set of submodules of the circuit design that contribute untested nodes to the one or more of the prioritized untested node clusters based at least one of the node testability data or the physical location data;
prioritize the at least one of a set of modules or a set of submodules based on a number of untested nodes contributed to the one or more of the prioritized untested node clusters by the at least one of a set of modules or a set of submodules; and
include within the test coverage data, at least one of
data associated with one or more of the prioritized untested node clusters of the plurality of untested node clusters; and
data associated with the prioritized at least one of the set of modules or the set of submodules.

15. A computer program product for determining test coverage in a circuit design, the computer program product comprising:
- a computer-readable storage medium having computer-readable program code embodied therewith, the computer-readable program code comprising instructions for:
    - obtaining node testability data and physical location data for each node of a plurality of nodes in a circuit design;
    - determining one or more low test coverage areas within the circuit design comprising untested nodes based on the node testability data and the physical location data of each node of the plurality of nodes;
    - generating test coverage data for the circuit design comprising at least an identification of the one or more low test coverage areas;
    - determining, based on the node testability data and the physical location data, at least one of a set of modules or a set of submodules of the circuit design within the one or more low test coverage areas, wherein the at least one of the set of modules or the set of submodules comprises the untested nodes; and
    - including at least an identification of the at least one of the set of modules or the set of submodules in the test coverage data; and
    - updating the circuit design based on the one or more low test coverage areas identified in the test coverage data, wherein updating the circuit design increases test coverage in at least one of the one or more low test coverage areas.

16. The computer program product of claim 15, wherein the determining the one or more low test coverage areas comprises identifying, based on at least the physical location data, a plurality of untested node clusters in one or more areas of the circuit design, and
  wherein the instructions are further for:
    prioritizing each untested node cluster of the plurality of untested node clusters based on at least a number of untested nodes within each untested node cluster;
    determining, for one or more of the prioritized untested node clusters, at least one of a set of modules or a set of submodules of the circuit design that contribute untested nodes to the one or more of the prioritized untested node clusters based at least one of the node testability data or the physical location data;
    prioritizing the at least one of a set of modules or a set of submodules based on a number of untested nodes contributed to the one or more of the prioritized untested node clusters by the at least one of a set of modules or a set of submodules; and
    including within the test coverage data, at least one of data associated with one or more of the prioritized untested node clusters of the plurality of untested node clusters; and
  data associated with the prioritized at least one of the set of modules or the set of submodules.

* * * * *